(12) United States Patent
Meltzer

(10) Patent No.: US 7,161,440 B2
(45) Date of Patent: *Jan. 9, 2007

(54) TEMPERATURE COMPENSATION CIRCUIT

(75) Inventor: David Meltzer, Wappingers Falls, NY (US)

(73) Assignee: Seiko Epson Corporation, Tokyo (JP)

( * ) Notice: Subject to any disclaimer, the term of this patent is extended or adjusted under 35 U.S.C. 154(b) by 133 days.

This patent is subject to a terminal disclaimer.

(21) Appl. No.: 10/733,143

(22) Filed: Dec. 11, 2003

(65) Prior Publication Data

US 2005/0128018 A1 Jun. 16, 2005

(51) Int. Cl.
*H03B 1/00* (2006.01)

(52) U.S. Cl. .................. 331/76; 331/74; 331/176; 331/DIG. 3; 331/175

(58) Field of Classification Search .................. 331/76, 331/176, 74, DIG. 3, 175
See application file for complete search history.

(56) References Cited

U.S. PATENT DOCUMENTS

| | | | |
|---|---|---|---|
| 3,483,485 A * | 12/1969 | Scherrer | ................. 331/116 R |
| 4,316,108 A | 2/1982 | Rogers, Jr. | |
| 4,378,534 A | 3/1983 | Goedken et al. | |
| 4,492,933 A | 1/1985 | Grieco | |
| 4,999,589 A | 3/1991 | DaSilva | |
| 5,097,228 A | 3/1992 | McJunkin | |
| 5,604,468 A | 2/1997 | Gillig | |
| 5,740,525 A | 4/1998 | Spears | |
| 6,198,356 B1 | 3/2001 | Visocchi et al. | |
| 2002/0149434 A1* | 10/2002 | Toncich et al. | ............. 331/158 |
| 2004/0124822 A1* | 7/2004 | Marinca | ..................... 323/313 |

* cited by examiner

*Primary Examiner*—Michael B Shingleton
(74) *Attorney, Agent, or Firm*—Rosalio Haro

(57) ABSTRACT

A temperature compensation circuit has multiple configurable modules to produce a compensation signal whose temperature characteristic curve is the inverse of the frequency-to-temperature characteristic curve of a specified oscillator. A set of first modules that produce first sub-signals directly proportional to temperature and a set of second modules that produce second sub-signals inversely proportional to temperature have their outputs summed at a summation node. Each module may adjust the strength and shaped of its temperature characteristic sub-signal, and each module may optionally be assigned a temperature offset that impedes the output of its corresponding sub-signal until the assigned temperature offset is reached. Each of the first and second modules includes a signal generator and an optional temperature offset circuit, which may be incorporated into the operation of the signal generator. To produce a compensation signal to compensate a SAW resonator, a first module having a temperature offset and being directly proportional to temperature is summed with a second module having no temperature offset and being inversely proportional to temperature.

67 Claims, 15 Drawing Sheets

$|V_1| \geq |V_2|$ : $T \leq T_{TRNSITN}$
$|V_1| < |V_2|$ : $T > T_{TRNSITN}$

TEMPERATURE COMPENSATION CIRCUIT

BACKGROUND OF THE INVENTION

1. Field of the Invention

The present invention relates generally to a temperature compensation circuits, and more particularly to circuits that compensate the temperature versus frequency characteristic of variable frequency oscillators, such as Surface Acoustic Wave resonators.

2. Description of the Related Art

An oscillator's output frequency will drift from a target, or center, frequency with variations in temperature. In precision frequency devices, frequency drift due to temperature variation is of primary concern since an oscillator's ambient temperature will fluctuate under normal use. Therefore, it is customary to provide an oscillator circuit with temperature compensation circuitry to attempt to stabilize the oscillator's output frequency over a predetermined operating temperature range.

Voltage (VCO) or current (CCO) controlled variable frequency oscillators are frequently used in precision clock generators for digital systems. These oscillators typically have a function control mechanism to adjust their frequency in accordance with system frequency variations. In such systems, it is important that the functional control signal additionally include sufficient signal control range to compensate for the frequency variations of oscillation due to circuit temperature variations. Thus, the temperature control range is in addition to the required range of the functional control mechanism used to compensate for normal system frequency variations. This temperature compensation requirement reduces the functional control pull range of the oscillator which imposes more stringent requirements on its functional behavior.

The basic ideal of temperature compensation for oscillators is relatively straight forward. With reference to FIG. 1, a typical temperature compensated oscillator consists of temperature compensation signal generator 1001 coupled to a control input of a variable oscillator 1002. Ideally, temperature compensation signal generator 1001 includes a temperature sensor for monitoring temperature changes, and generates a signal selected to increase or decrease the frequency of variable oscillator 1002 in such a way so as to counteract the natural frequency drift of variable oscillator, 1002 due to temperature variation. That is, if a temperature change would naturally cause the operating frequency of uncompensated variable oscillator 1002 to drift upward, i.e. increase, temperature compensation signal 1001 would preferably produce a signal instructing variable oscillator 1002 to lower its operating frequency by an amount sufficient to counteract the oscillator's temperature induced, natural upward drift. Similarly, if the frequency of variable oscillator 1002 were to naturally decrease due to a change in temperature, temperature compensation signal 1002 should instruct variable oscillator 1002 to increase its operating frequency to counteract this downward drift.

In practice, however, it is difficult to construct a temperature compensation signal generator that produces an output compensation signal that varies with temperature in manner sufficiently inverse to that of variable oscillator 1002 over a wide temperature range. This is especially true of high precision oscillators. Prior art temperature, compensation signal generators typically use a diode as a temperature sensor since a diode's characteristics are uniformly dependent on temperature, as shown in U.S. Pat. No. 5,097,228. However, an oscillator's natural frequency drift due to temperature might not be uniform with temperature. That it, within a first temperature range, the oscillator's frequency may naturally increase with increasing temperature, but within a different temperature range, the same oscillator's frequency may naturally decrease with increasing temperature. Thus direct use of a temperature sensor uniformly dependent on temperature to compensate an oscillator's temperature drift may not be suitable for all oscillators over extended temperature ranges.

To address this non-uniformity in the frequency drift of some oscillators, another approach attempts to compensate for temperature variations by first observing an oscillator's natural (i.e. uncompensated) temperature drift over a specified temperature range of interest. The observed frequency variations are digitally recorded in a memory and compensation signal values corresponding to each observed frequency variation are likewise recorded in the memory. In operation, a temperature sensor diode is used to monitor temperature variations, and the output from the sensor diode is applied to an analog-to-digital converter to obtain a digital representation of the temperature variation. The digital representation of the temperature variation is used to lookup its corresponding compensation signal value in the memory. The thus acquired compensation signal value is applied to a digital-to-analog converter to create an equivalent analog compensation signal that is applied to the oscillator. A similar type of temperature compensation control is shown, for example, in U.S. Pat. No. 5,604,468. However, this approach to temperature compensation requires much additional circuitry, much initial testing to setup a look-up table in the memory, and added complexity.

U.S. Pat. No. 4,492,933 to Grieco shows a temperature compensation circuit that avoids the use of A/D and D/A converters and does not require digital memory for compensating an oscillator having a frequency response that is parabolic (i.e. non-uniform) with respect to temperature. However, Grieco's approach still requires discrete jumps in the compensation signal, as well as complicated circuitry, such as differential amplifiers, integrators, one-shot circuits, and sample-and-hold circuitry, all of which place operating frequency limitations on the compensation circuitry as well as complicating its construction.

With reference with FIG. 2, Grieco explains that the frequency-to-temperature characteristic curve of a surface acoustic wave (SAW) device is a concave down parabolic curve 1011, and that a temperature compensation curve 1013 should therefore ideally be a concave up parabolic curve 1013 since its shape ought to be the inverse of the temperature characteristic curve 1001. To generate a concave up curve, Grieco divides the temperature range of FIG. 2 into a "cold end" (the rising part of curve 1001 up to its apex) and a "hot end" (the falling part of curve 1001 down from its apex).

Grieco first explains how to create a half-parabolic curve having a generally concave up shape to compensate the "cold end" of curve 1011. To achieve this, as shown in FIG. 3, Grieco provides a temperature sensor circuit 1014 whose output voltage 1016, as it would be understood in the art, drops as temperature increase, as indicate in FIG. 4.

With reference with FIG. 5, Grieco also provides a series of linear timing ramps 1015 to define sampling periods SP1 to SPn. Linear timing ramps 1015 are integrated to generate a series of half parabolic curves 1017 whose periods are defined by the sampling periods SP1 to SPn. Within each sampling period, the voltage of a half parabolic curve 1017 is sampled when the magnitude of the linearly increasing ramp 1015 rises above output signal 1016, which is a measure of temperature as determined by temperature sensor circuit 1014. These sampling points are indicates by one-shot pulses 1019. The sampled voltage values of half parabolic curve 1017 become a sampled compensation signal that can be applied to the SAW device to compensation for temperature variation.

Thus when the temperature is low and output voltage 1016 is high, voltage ramp 1015 will not rise above output voltage 1016 until sometime close to the end of the sampling period. By that time, half parabolic curve 1017 will be high and thus provide a high sampled compensation signal value to compensate for low temperature. Conversely when the temperature is high and output voltage 1016 is therefore low, voltage ramp 1015 will rise above output voltage 1016 sometime closer to the beginning of the sampling period when half parabolic curve 1017 is lower. This provides a lower sampled compensation signal value to compensate for higher temperature.

An illustration of this process is shown in FIG. 6, where the shape of parabolic curve 1017 is effectively mirrored by the negative slope of output voltage 1016 of temperature sensor 1014 to produce a sampled compensation signal curve 1021 consisting of discrete steps that together form a shape that is some-what parabolic, negatively sloped, and concave up.

Grieco provides the circuit shown in FIG. 7 for accomplishing this task. As explained above, a series of linear timing ramps 1015 is applied to an integrator 1017' to produce half-parabolic curves 1017. The output from temperature sensor 1014 is compared with linear voltage ramps 1015 at comparator 1023, whose output is applied to a one-shot circuit 1019' to produce one-shot pulses 1019. A sample-and-hold circuit 1025 samples the value of half-parabolic curves 1017 at points in time indicated by one-shot pulses 1019, and the sampled outputs 1021 are applied to a varactor 1029. As it would be understood, varactor 1029 is part of the SAW resonator based oscillator, and modulates the frequency of the oscillator in accordance with the sampled compensation signal 1021.

As explained above, however, this circuit compensates only the "cold end" of curve 1011. To compensate both the "cold end" and "hot end" of curve 1011, Grieco provides the circuit of FIG. 8, where first temperature sensor 1014 is used to compensate the "cold old" of curve 1011, and a second temperature sensor 1014' is used to compensate the "hold end" of curve 1011.

To compensate the "hot end", Grieco applies the output of second temperature sensor 1014' to an inverting amplifier 1031 to produce an output voltage 1016' whose general shape is the inverse of output voltage 1016, i.e. a positively sloped voltage as shown in FIG. 9.

With reference to FIG. 9, projecting the same stream of half-parabolic curves 1017 onto positively-sloped, output voltage 1016' results in a second discrete sampled compensation signal 1021' whose shape is some-what parabolic, positively sloped, and concave up curve.

Returning to FIG. 8, the output from inverting amplifier 1031 is compared with linear timing ramps 1015 by a second comparator 1037, whose output is applied to a second one-shot circuit 1039. The output of second one-shot circuit 1039 is applied to a second sampling trigger input of sample-and-hold circuit 1025.

However, since sample-and-hold circuit 1025 is now responsive to a first trigger input from first one-shot circuit 1019' and response to a second trigger input from second one-shot circuit 1039, and since each of first one-shot circuit 1019 and second one-shot circuit 1039 individually output a separate pulse signal within each sampling period defined by linear timing ramps 1015, it follows that sample-and-hold circuit 1025 must sample half-parabolic curve 1017 twice during each sampling period. As a result, the compensation signal applied to varactor 1029 is changed twice during each sampling period irrespective of whether the temperature remained unchanged.

With reference to FIG. 10, eight exemplary sampling periods SP1–SP8 are shown. Because of the positive slop of linear timing ramps 1015, the second sample during each sampling period is always from the higher voltage of the two parabolic curves 1021 and 1021' (shown in FIGS. 8 and 9). Nonetheless, it is clear that a first lower sample is momentarily taken prior to the second higher voltage sample. Thus, sample-and-hold circuit 1017 must be fast enough to make two separate sampling operations per sampling period. Since a sample-and-hold's response time is limited by the discharge rate of its charging capacitor, the operating frequency of this circuit is limited by the sample-and-hold's response time.

Additionally, the linear timing ramps 1015 cannot be made to have a saw-tooth waveform shape, but rather must have an initial zero-value, flat section at the beginning of each sampling cycle, as shown in FIGS. 5, 7 and 8 in order for the one-shot circuits 1019 and 1019' to recharge. This further decreases the sampling rate.

What is needed is a simplified circuit that does not require additional A/D and D/A conversion, or additional decoding circuitry and memory. The simplified circuit should preferably also provide continuous temperature compensation (i.e. not discrete), and be flexible enough to support oddly shaped frequency-to-temperature characteristic curves of some oscillators without introducing instabilities, or placing harsh limits on its operating frequency.

OBJECTS OF THE INVENTION

One object of the present invention is to provide a temperature compensation circuit suitable for a wide range of oscillator types irrespective of the shape of their frequency-to-temperature characteristic curve.

A second object of the present invention is to provide a simplified temperature compensation circuit for use with a surface acoustic wave resonator based oscillator.

A third object of the present invention is to provide a simplified temperature compensation circuit that provides continuous temperature compensation over a desired temperature range.

SUMMARY OF THE INVENTION

The above objects are achieved in a circuit that generates a current (and through obvious extension, a voltage) whose proportionality to temperature is the inverse of the relationship between frequency of oscillation and temperature of an oscillator (preferably a SAW resonator based oscillator, which is used in various electronic devices such as cellular telephones).

To achieve this, a general embodiment of the present invention includes a number of first modules each capable of producing a respective first sub-signal directly proportional to temperature, and includes a number of second modules each capable of producing a respective second sub-signal inversely proportional to temperature. Each module may adjust the strength of, and have a differently shaped temperature characteristic curve for, its respective output sub-signal. Furthermore, each module may optionally be assigned a temperature offset, which may impede the output of its corresponding sub-signal until the assigned temperature offset is reached, and/or shift the temperature characteristic curve of its corresponding sub-signal by the assigned temperature offset. Also, a DC offset may be optional assigned to each module, which is added to the module's corresponding output sub-signal.

The output of the first and second modules is added at a summation node, and the resultant summed signal may be shifted up or down by another optional DC offset prior to being applied to a variable oscillator. By appropriate selection of the shape of each module's temperature characteristic curve, the relative strength of each module's sub-signal, and assigning an appropriate temperature offset for each module, the resultant summed signal is a composite temperature characteristic curve that can be made to have a wide range of shapes. Thus, the composite temperature characteristic curve can be made to be the inverse of the relationship between frequency of oscillation and temperature of wide number of oscillator types.

If desired, the output of the first modules may be combined to create a first composite sub-signal directly proportional to temperature, and the output the second modules may be combined to create a second composite sub-signal inversely proportional to temperature, and the first and second composite sub-signals may then be summed at the summation node.

Each of the first and second modules includes a signal generator and an optional temperature offset circuit, which may be incorporated into the operation of the signal generator. As explained above, the assignment of a temperature offset is optional, and if no temperature offset is to be assigned to a particular module, then that module's temperature offset circuitry may be omitted to simplify its construction.

The qualitative shape of the frequency-versus-temperature characteristic curve of an uncompensated SAW resonator based oscillator is generally concave downward with a variation over the temperature range of interest of 100 ppm, or more. The compensation circuit must generate a voltage or current which is the inverse of this uncompensated curve. That is, the compensation circuit produces a compensation signal that is concave upward with a minimum centered at the temperature at which the uncompensated oscillator's maximum frequency occurs. A temperature compensation signal that is the exact inverse of the frequency-versus-temperature curve of an uncompensated SAW resonator may be created with multiple first modules and/or multiple second modules to construct an appropriately shaped first composite sub-signal directly proportional to temperature and to construct an appropriately shaped second composite sub-signal inversely proportional to temperature. The first and second composite sub-signals may then be summed at the summation node to produce the desired composite compensation signal.

A preferred embodiment of the present invention, however, provides a simplified temperature compensation circuit to create a temperature compensation signal whose shape is substantially, although maybe not exactly, the inverse of the frequency-versus-temperature curve of an uncompensated SAW resonator based oscillator. This is accomplish by assuring that key points within the temperature compensation signal are the exact inverse of corresponding points in the uncompensated oscillator's frequency-versus-temperature curve. This preferred embodiment utilizes only one first module, which is directly proportional to temperature, and one second module, which is inversely proportional to temperature.

In the presently preferred embodiment, the first module is given an assigned temperature offset, and the temperature offset circuit is preferably incorporated into the first module's corresponding signal generator. The second module is preferably not assigned any temperature offset and therefore its corresponding signal generator does not incorporate any temperature offset circuitry.

The second module is achieved using a Complementary To Absolute Temperature (CTAT) signal source and a current mirror.

The first module produces a compensation sub-signal that is directly proportional to temperature and has a temperature offset by appropriate balancing of another CTAT signal source and a Proportional To Absolute Temperature (PTAT) signal source. The temperature offset is achieved by assuring that the CTAT signal source is of greater magnitude than the PTAT signal source for temperatures below a predetermined transition temperature, and assuring that the CTAT signal source is of lesser magnitude than the PTAT signal source for temperatures higher than the predetermined transition temperature. Depending on the characteristics of the CTAT and PTAT signal sources used, the transition temperature may be made proximate to, or equal to, the assigned temperature offset. The difference of the outputs from the CTAT and PTAT signal sources defines a difference signal that is applied to a dependent signal source. Preferably, the dependent signal source produces an output signal dependent on the difference signal only when the difference signal is greater than a predefined threshold value, and produces no output signal when the difference signal is less than the predefined threshold value.

Further preferably, the present invention is implemented using CMOS technology. The CMOS circuitry of the invention is at least partly based on the voltage versus temperature characteristics of a parasitic bipolar junction present in all CMOS manufacturing processes. These parasitic junctions can be made to form a low β PNP transistor, which are the basis of the PTAT and CTAT reference signal sources.

Other objects and attainments together with a fuller understanding of the invention will become apparent and appreciated by referring to the following description and claims taken in conjunction with the accompanying drawings.

DESCRIPTION OF THE PREFERRED EMBODIMENTS

Preferred embodiments of the present invention are described below with reference to the accompanying figures.

Different oscillator types respond differently to changes in temperature. An understanding of how an oscillator's output frequency shifts under a varying temperature my be obtained by observing the oscillator's frequency-to-temperature characteristic curve, i.e. a plot of how the oscillator's output frequency naturally varies over a predefined temperature range. For illustrative purposes, the present invention is exemplarily applied to a surface acoustic wave (SAW) resonator based oscillator (i.e. an oscillator using a SAW type filter), but it is to be understood that the present invention may equally be applied to other types of oscillators with minor modification to presented procedure and circuitry.

Figure 1:
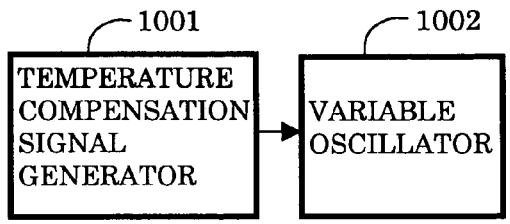
FIG. 1 is a block diagram of a typical temperature compensated oscillator.
Figure 2:
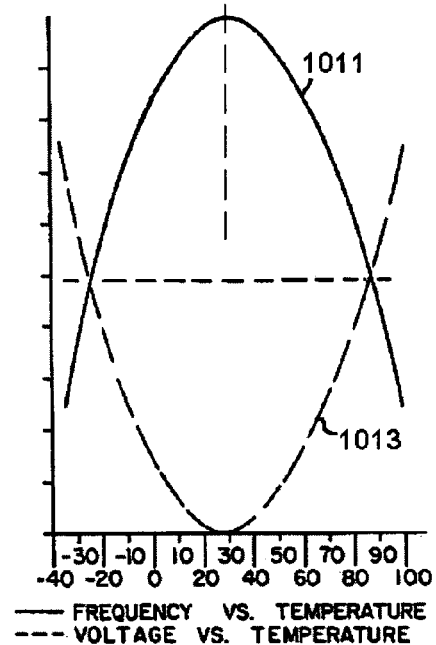
FIGS. 2–10 are various exemplary illustrations of a prior art temperature compensation circuit, as described in U.S. Pat. No. 4,492,933.
Figure 4:
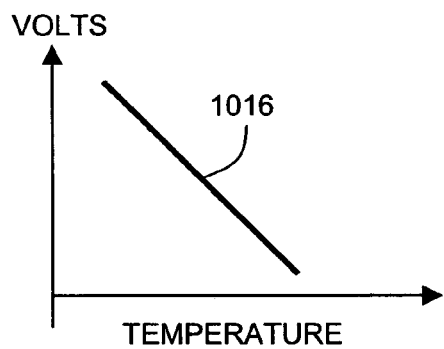
Figure 3:
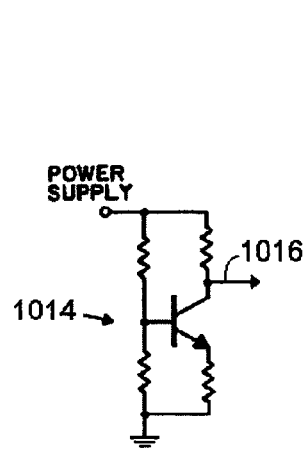
Figure 5:
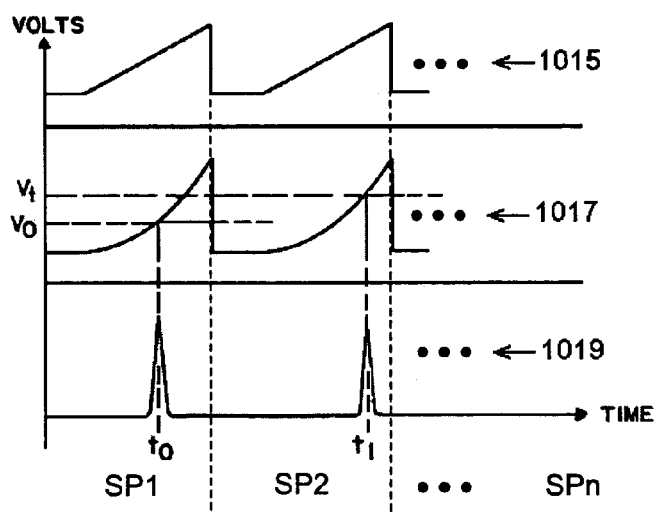
Figure 6:
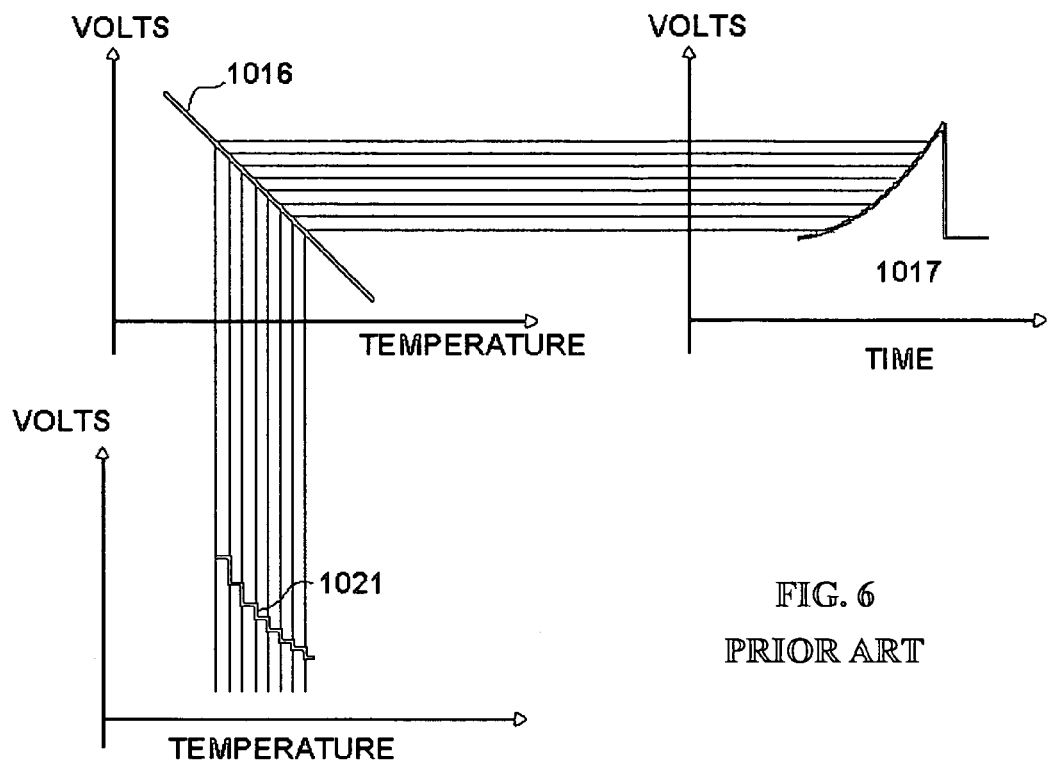
Figure 9:
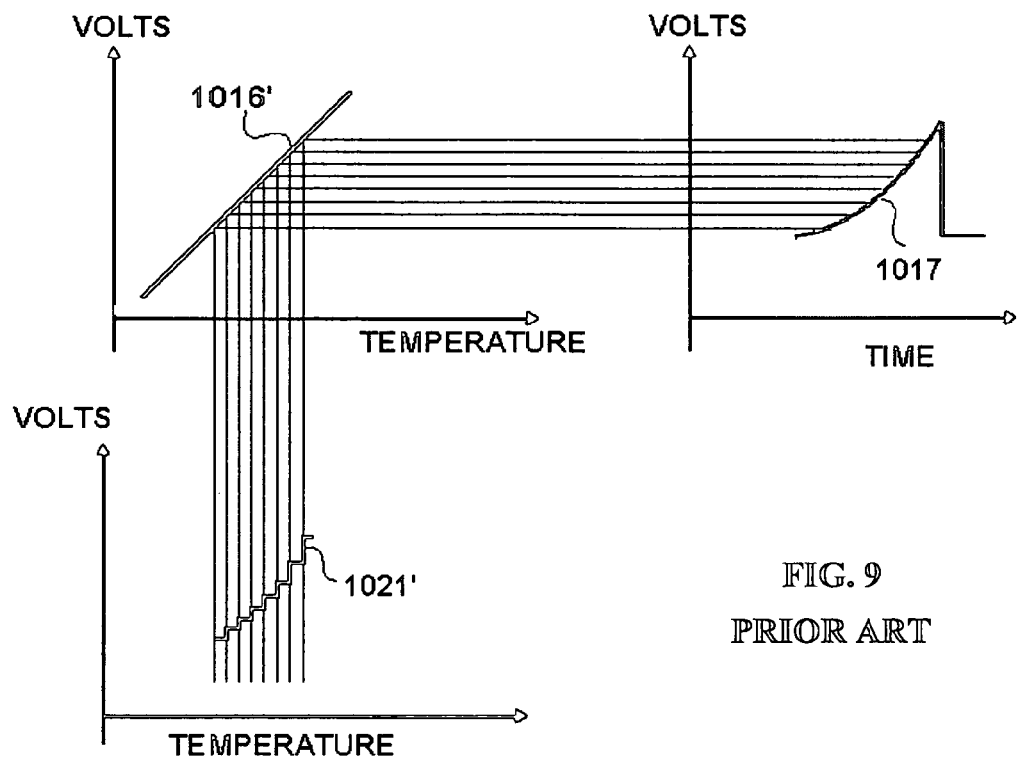
Figures 7, 10:
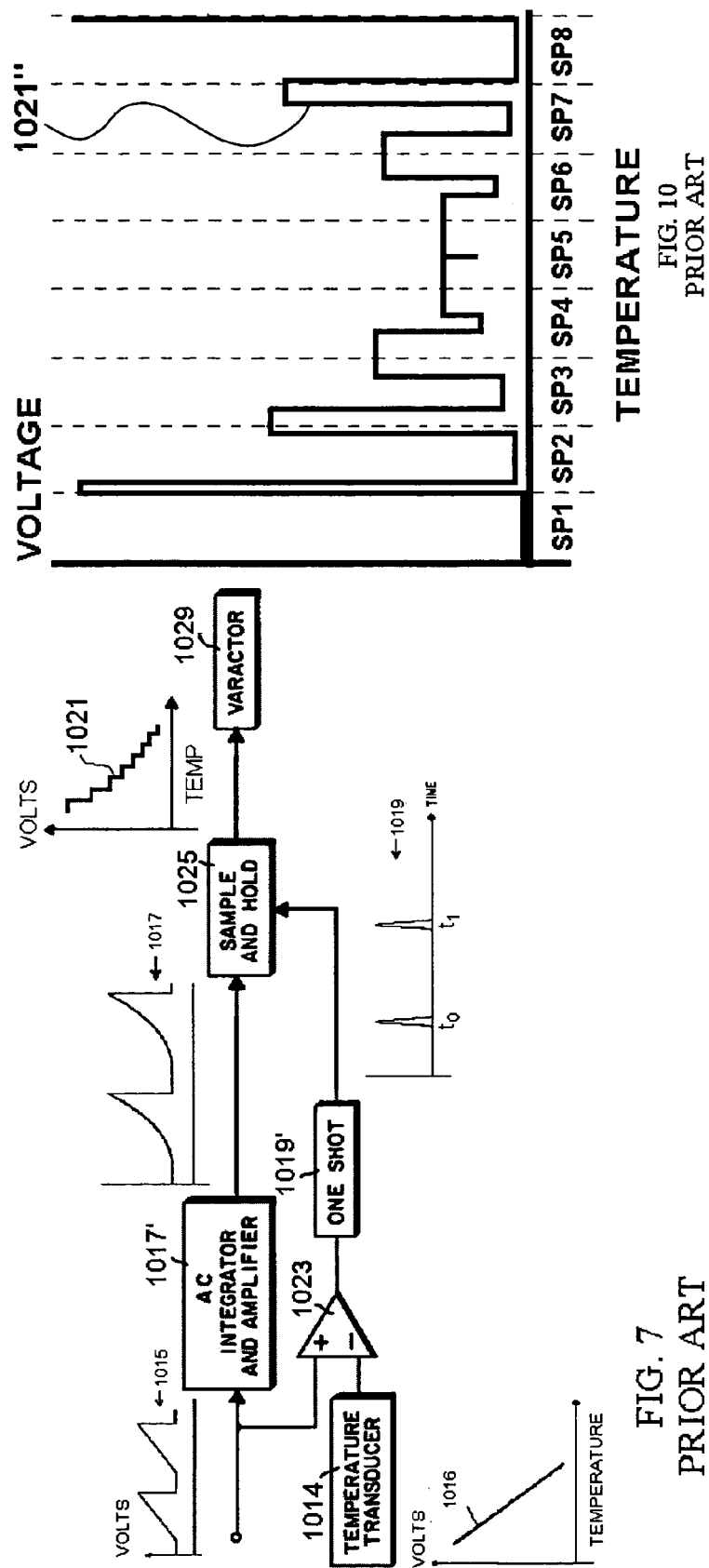
Figure 8:
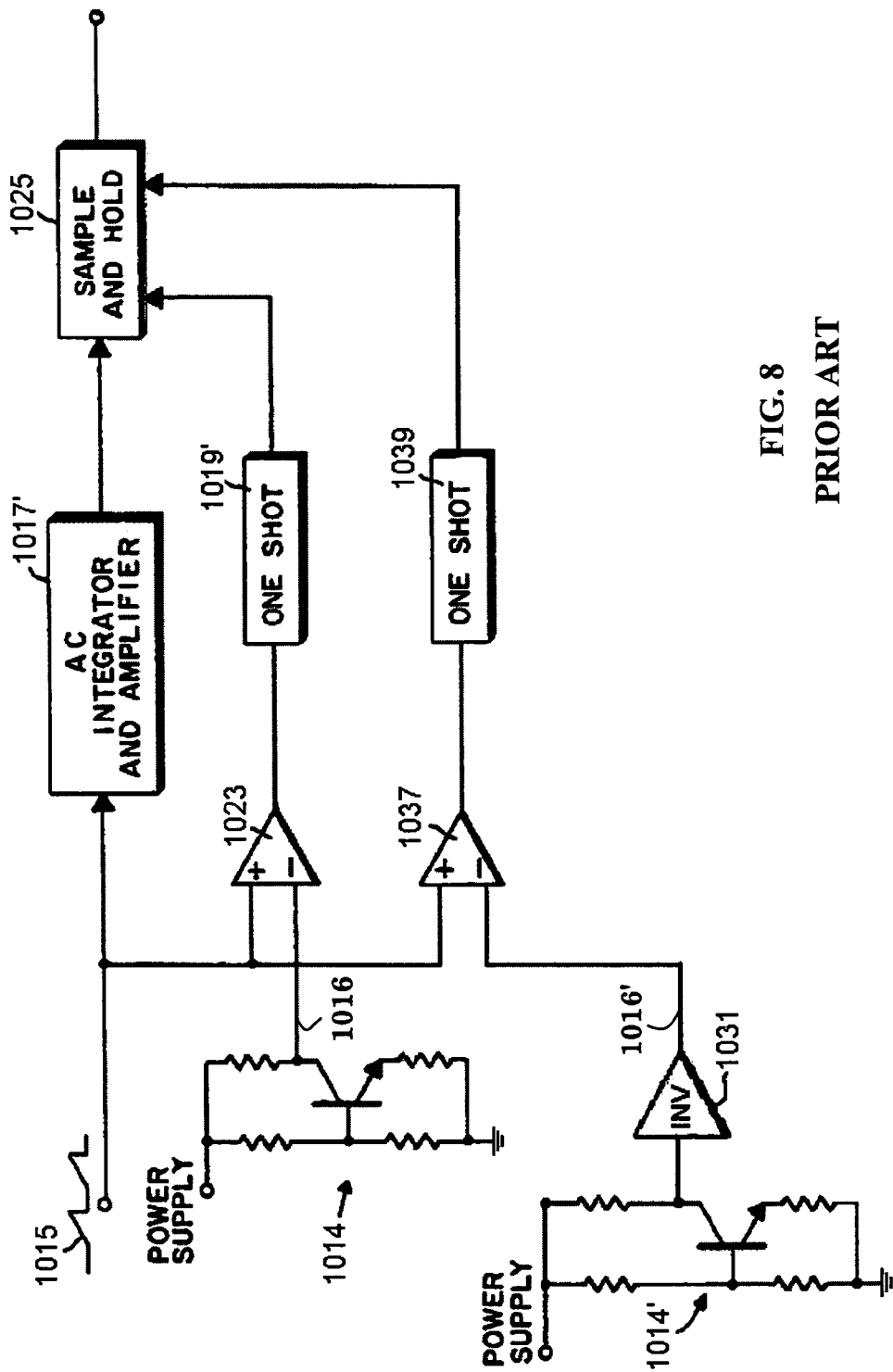
Figure 11:
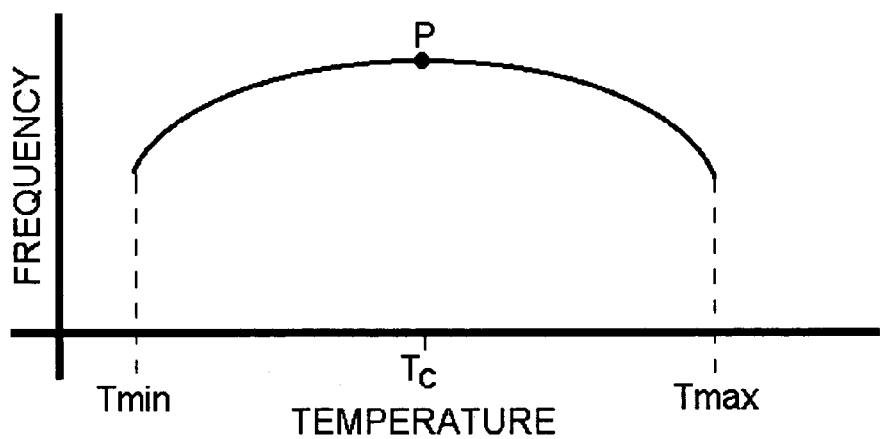
FIG. 11 is an exemplary frequency-versus-temperature characteristic curve of a SAW resonator.

With reference to FIG. 11, the qualitative shape of a frequency-to-temperature characteristic curve of a SAW resonator based oscillator without temperature compensation has a generally curved shape. The uncompensated frequency initially increases with increasing temperature and then begins to level off. At a center temperature Tc, the frequency reaches a peak (indicated by point P) and then begins to decrease with increasing temperature. This results in the frequency-to-temperature characteristic curve of the SAW resonator based oscillator having a generally concave-down shape with a peak uncompensated frequency at temperature Tc, generally mid-way within the operating temperature range of interest (i.e. from Tmin to Tmax). Observation further reveals that the exemplary SAW resonator based oscillator may exhibit a frequency variation of about 100 ppm, or more, over the temperature range of interest.

To offset this drift in oscillation frequency, a temperature compensation circuit should ideally provide a compensation signal whose shape is the inverse of the frequency-to-temperature characteristic curve of the uncompensated oscillator. That is, when the oscillator's uncompensated frequency would tend to increase due to a change in temperature, the compensation signal should instruct the oscillator to decrease its output frequency to maintain its frequency stable. Similarly, when the oscillator's uncompensated frequency would tend to decrease due to a change in temperature, the compensation signal should instruct the oscillator to increase its output frequency to maintain its frequency stable.

In the present case, therefore, the preferred compensation circuit should produce a compensation signal having a concave-up curvature over the temperature range from Tmin to Tmax, and having its minimum value at Tc, i.e. the temperature corresponding to point P, where the oscillator's maximum uncompensated frequency occurs. The compensation signal may be a voltage or current signal, and the oscillator maybe a voltage controlled oscillator (VCO) or a current controlled oscillator (CCO).

Figure 12:
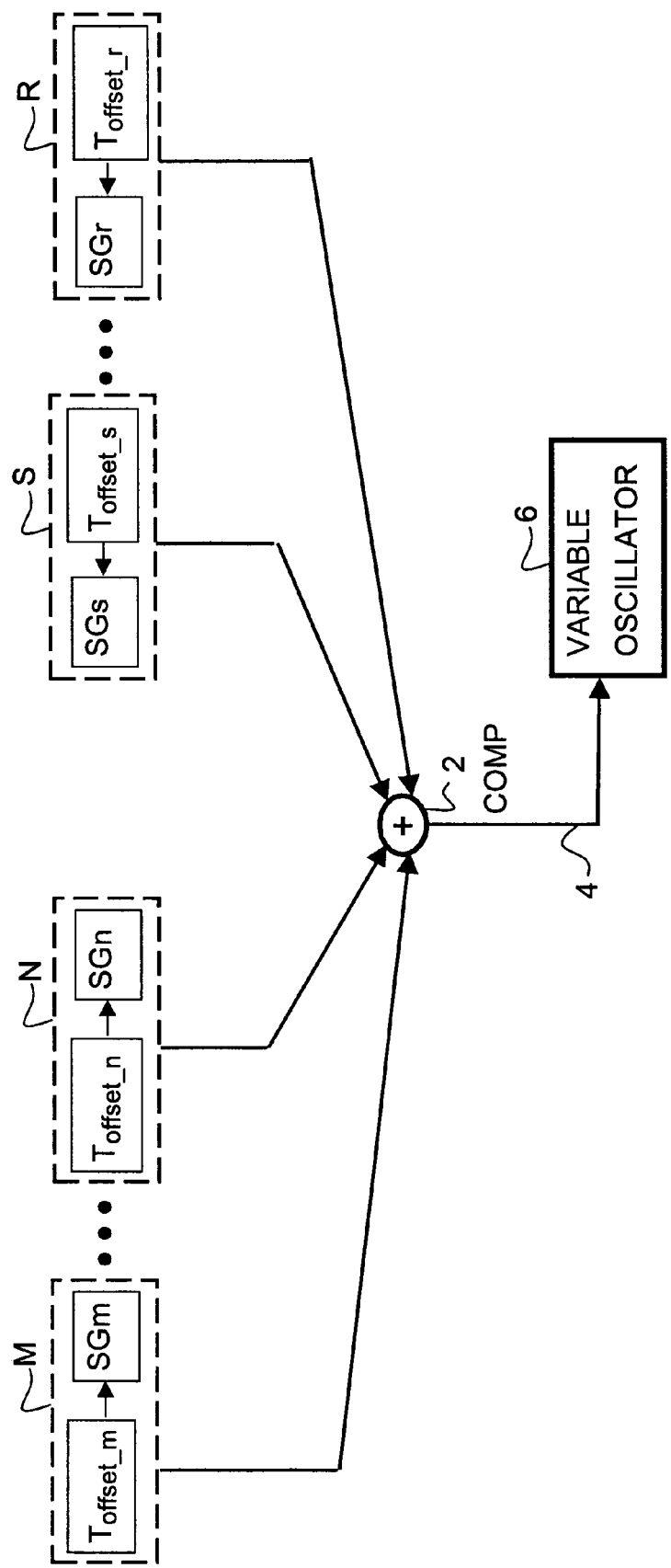
FIG. 12 is a block diagram of a frequency compensation circuit in accord with a first embodiment of the present invention.

With reference to FIG. 12, a general block diagram of a preferred circuit structure in accord with the present invention includes several individually modifiable modules M to N and R to S. The turn-on temperature point and the signal strength of each circuit module M to N and R to S is preferably adjustable, and the signals from the modules are summed to produce a composite temperature compensation signal COMP having a specifically desired curvature over a given temperature range.

M to N and R to S are temperature dependent, signal generating modules whose outputs are summed at summation node 2 to produce composite compensation signal COMP on output line 4, which can be applied to a variable oscillator 6. As explained above, oscillator 6 may be a SAW resonator based oscillator used in various high frequency electronic devices, such as cellular telephones and high speed serial communication networks. Each of signal modules M to N and R to S preferably produce a temperature dependent signal that is either directly proportional to temperature (i.e. modules M to N) or inversely proportional to temperature (i.e. modules R to S), and whose magnitude is weighted (i.e. amplified positively or negatively) to achieve a desired shape for compensation signal COMP. Additionally, each module is optionally capable of inhibiting its output (i.e. produce no output) until a pre-assigned temperature offset is reached. Further preferably, each module M to N and R to S may optionally be made to shift its characteristic temperature curve up or down in temperature, as specified by the temperature offset.

To achieve this, each module M to N and R to S is shown to include a temperature dependent signal generator (SGm to SGn and SGr to SGs), each having a characteristic temperature dependent curve. Each module may further include an optional temperature offset indicator ($T_{offset\_m}$ to $T_{offset\_n}$ and $T_{offset\_r}$ to $T_{offset\_s}$) for setting the desired temperature offset. Each temperature offset indicator may function to inhibit the output of its corresponding signal generator until a predefined temperature is reached, or alternatively may function to shift the characteristic temperature curve of its corresponding signal generator by the predefined temperature offset.

For example, modules M to N include respective signal generators SGm to SGn, each of which produces a temperature dependent signal whose magnitude is directly proportional to temperature (i.e., $\alpha T$). Modules M to N further preferably include respective temperature offset circuits $T_{offset\_m}$ to $T_{offset\_n}$, which determine at what temperature their corresponding signal generators SGm to SGn will begin to output their temperature dependent signals (that is, each temperature offset circuit sets the minimum operating [i.e. turn-on] temperature of its respective module). It is to be understood that if no specific temperature offset is desired for a particular module, then the module's corresponding temperature offset circuit may be omitted so that its corresponding signal generator is permitted to function without any temperature offset. This would be similar to a temperature offset circuit applying a signal indicative of no temperature offset to its corresponding signal generator. It is further to be understood that although each module's signal generator and temperature offset circuit and are shown separately, they may be combined into a single circuit structure comprising a signal generator with an assigned, but nonetheless integral, temperature offset circuit.

Similarly, modules R to S respectively include signal generators SGr to SGs, each of which produces a temperature dependent signal whose magnitude is inversely proportional to temperature (i.e., $\alpha[1/T]$). Each module R to S may further include an optional temperature offset circuit $T_{offset\_r}$ to $T_{offset\_s}$, which determines at what temperature its corresponding signal generator SGr to SGs begins outputting its temperature dependent signal (i.e. sets the turn-on temperature). It is to be understood that if no specific temperature offset is desired for a particular signal generator, then its corresponding temperature offset circuit may be omitted. Alternatively, the temperature offset circuit may be integrally constructed into the signal generator.

By appropriate selection of the number of signal generators directly proportional to temperature (SGm to SGn), appropriate selection of the number of signal generators inversely proportional to temperature (SGr to SGs), appropriate assignment of their relative signal strengths (positive or negative), and appropriate selection of their temperature offsets, composite compensation signal COMP on line 4 may be made to have a shape that is the inverse of the frequency-to-temperature characteristic curve of oscillator 6, irrespective of the type of oscillator.

The present invention is illustratively applied to a SAW resonator based oscillator, whose frequency-to-temperature characteristic curve is described above in reference to FIG. 11. An explanation of how the structure of FIG. 12 can be used to create compensation signal whose shape is the exact inverse of the frequency-to-temperature characteristic curve of FIG. 11, can be obtained by first assuming that all the outputs of modules M to N are summed to create a first composite, inversely proportional to temperature sub-signal, C_IPT. It is further assumed that all the outputs of modules R to S are summed to create a second composite, directly proportional to temperature sub-signal, C_DPT. The first and second sub-signals C_IPT and C_DPT are then summed at summation node 2. First is to be understood that this is the same as summing all modules M to N and R to S at summation node 2, but constructing the first and second sub-signals C_IPT and C_DPT provides useful visual aids, as shown in FIG. 13.

Figure 13:
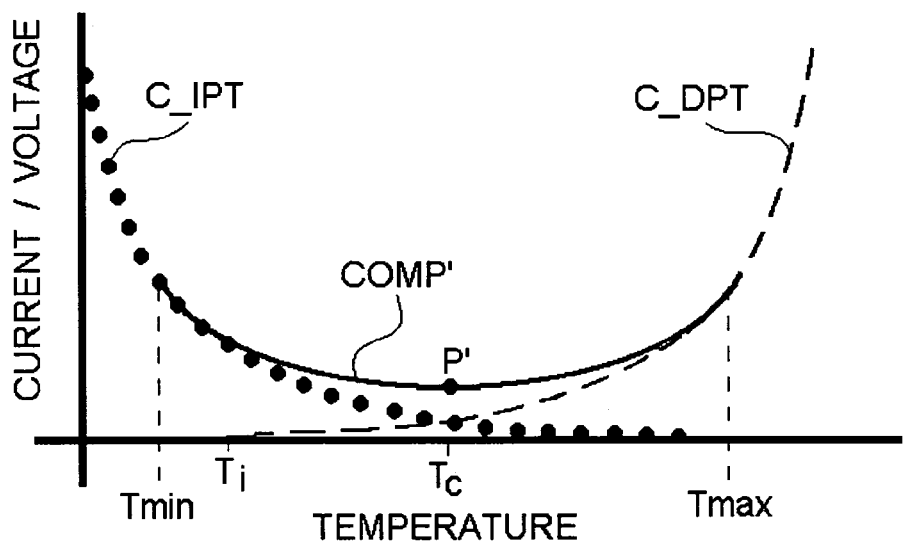
FIG. 13 is an exemplary frequency compensation curve COMP' in accord with the embodiment of FIG. 12.

For example with reference to FIG. 13, through the appropriate choice of the number of signal generators inversely proportional to temperature (SGr to SGs), appropriate assignment of their gain and any temperature offsets, composite inversely proportional to temperature sub-signal C_IPT may be constructed. Similarly, by appropriate selection of the number of signal generators directly proportional to temperature, adjustment of their relative gains, and assignment of any temperature offsets, composite directly proportional to temperature sub-signal C_DPT may be created. Composite sub-signals C_IPT and C_DPT are summed to create composite compensation signal COMP'.

To assure that compensation signal COMP' has a shape that is exactly the inverse of the frequency-to-temperature characteristic curve of FIG. 11, it is necessary that sub-signal C_DPT be given a temperature offset $T_i$, and that the curvature of sub-signals C_IPT and C_DPT by made slightly flatten such that their sum results in compensation signal COMP' having its lowest value P' at temperature $T_C$, corresponding to the temperature at which the frequency-to-temperature characteristic curve of FIG. 11 reaches its maximum frequency at point P. In the present case, temperature offset $T_i$ is within the desired operating temperature range Tmin to Tmax, and compensation signal COMP' therefore initially follows sub-signal C_IPT until temperature $T_i$ is reached and sub-signal C_DPT is initiated. At this point, compensation signal COMP' begins to separate from sub-signal C_IPT, and its shape is defined by the sum of sub-signals C_IPT and C_DPT. At higher temperatures, sub-signal C_IPT decreases closer to zero while sub-signal C_DPT continues to grow, and the shape of compensation signal COMP' begins to follow signal C_DPT more closely.

However for many practical applications, it is not necessary that the compensation signal be an exact inverse of the frequency-to-temperature characteristic curve. Satisfactory performance can often be obtained by assuring that the compensation signal has a generally inverse shape, and that its peaks coincide with selected peaks on the frequency-to-temperature characteristic curve. This permits construction of a simplified compensation circuit in accord with the present invention.

Figure 14:
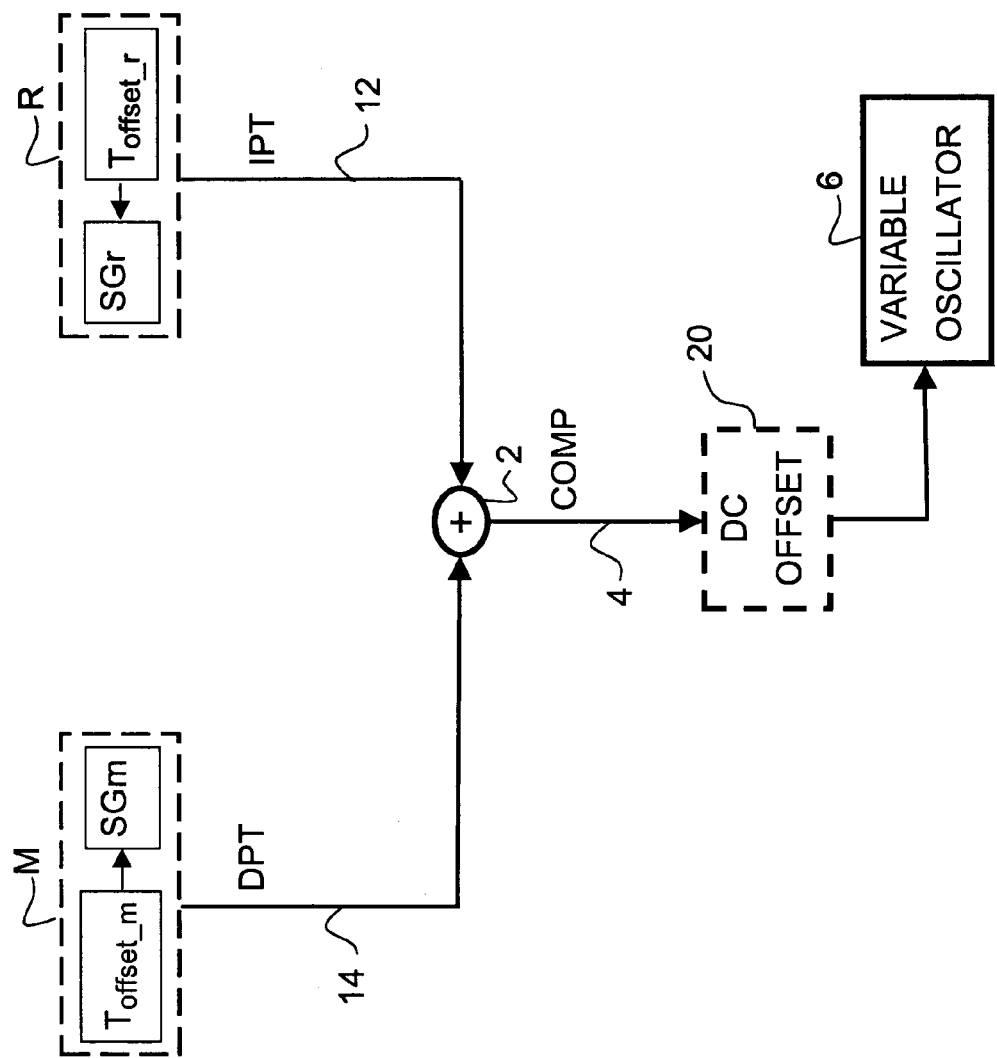
FIG. 14 is a block diagram of a frequency compensation circuit in accord with a preferred embodiment of the present invention.

Therefore with reference to FIG. 14, the presently preferred embodiment uses only two modules, M and R, to provide a simplified implementation for producing a temperature compensation signal having a shape that is substantially the inverse of the frequency-to-temperature characteristic curve of FIG. 11. First module M produces an output sub-signal DPT on line 14 that is directly proportional to temperature, and second module R produces an output sub-signal IPT on line 12 that is inversely proportional to temperature. Sub-signals DPT and IPT are combined at summing node 2, and the resultant compensation signal COMP may be directly applied to variable oscillator 6. In the present case, variable oscillator 6 is preferably implemented as a SAW resonator based oscillator.

Alternatively, compensation signal COMP may be coupled to variable oscillator 6 via an optional DC offset 20 (indicated by a dotted box) to add a positive or negative DC offset to compensation signal COMP prior to it being applied to variable oscillator 6. This provides a further adjustment to the temperature compensation of variable oscillator 6, if necessary.

First module M includes temperature offset circuit $T_{offset\_m}$ for setting a first offset temperature $T_i$, and includes signal generator SGm whose output is directly proportional to temperature. Signal generator SGm is responsive to temperature offset circuit $T_{offset\_m}$. Second module R includes signal generator SGr whose output is inversely proportional to temperature, and may optionally include temperature offset circuit $T_{offset\_r}$ for setting a second offset temperature $T_2$. Signal generator SGr is responsive to temperature offset circuit $T_{offset\_r}$ However in the present implementation, temperature offset $T_2$ is preferably set to zero offset, and optional temperature offset circuit $T_{offset\_r}$ may therefore be omitted.

Since in the presently preferred embodiment, it is not necessary for signal generator SGr to have a temperature offset $T_2$ to achieved a concave-up shape for compensation signal COMP on output line 4, temperature offset circuit $T_{offset\_r}$ is not used in the preferred embodiment of the present invention. Therefore, temperature offset circuit $T_{offset\_r}$ is omitted from more detailed views of the present embodiment. However, it is to be understood that if it were required, $T_{offset\_r}$ may be implantation in a similar manner to that of temperature offset circuit $T_{offset\_m}$, described below.

Since in the present embodiment oscillator 6 is implemented as a SAW resonator based oscillator, for the sake of discussion the frequency-to-temperature characteristic curve of oscillator 6 is assumed to be characterized by the concave down curve of FIG. 11. Compensation signal COMP on output line 4 from summation node 2 should therefore preferably have a shape that is generally the inverse of the concave-down curve of FIG. 11.

Figure 15:
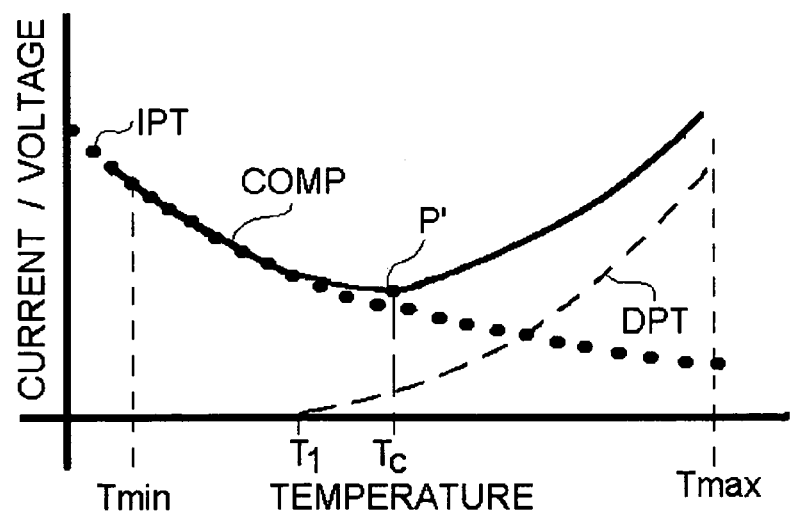
FIG. 15 is an exemplary frequency compensation curve COMP in accord with the embodiment of FIG. 14.

With reference to FIG. 15, compensation signal COMP on output 4 is shown to be a concave-up curve having characteristics generally inverse that of the concave-down frequency-to-temperature characteristic curve of FIG. 11. As stated above, compensation signal COMP on line 4 may be shifted up or down by means of optional DC offset 20, or any required DC offset may also be obtained by adjusting amplification gains of signal generators SGm and/or SGr.

In FIG. 15, sub-signal IPT of signal generator SGr is indicated by a dotted line, and sub-signal DPT of signal generator SGm is indicated by a dashed line. Sub-signals IPT and DPT are summed at summation node 2 to produce compensation signal COMP, whose representation between temperature range Tmin to Tmax is indicated by a solid line.

Sub-signal IPT has no temperature offset, and demonstrates a characteristic curve complementary (i.e. inversely related) to temperature. However, sub-signal DPT is halted until activation temperature $T_1$ is reached (i.e. the output of signal generator SGm is offset by $T_1$). Consequently, compensation signal COMP initially follows sub-signal IPT until temperature $T_1$ is reached and sub-signal DPT is activated. At $T_1$, sub-signal DPT begins to grow with increasing temperature. Both sub-signals IPT and DPT preferably follow an exponential-curve shape, but this is due to the nature of the preferred circuit implementation of signal generators SGm and SGr, explained below, and other directly proportional to temperature and inversely proportional to temperature characteristic curves may be used.

As shown, when sub-signal DPT is activated, compensation signal COMP begins to separates from sub-signal IPT. Compensation signal COMP then begins curving upwards as sub-signal DPT increases and sub-signal IPT decreases with temperature. As higher temperatures are reached, sub-signal IPT approaches zero while sub-signal DPT continues to rise, and compensation signal COMP eventually begins following curve DPT as sub-signal IPT becomes increasingly smaller. This results in compensation signal COMP having a concave-up shape, as desired for compensating the frequency-to-temperature characteristic curve of FIG. 11. By appropriate selection of the relative strengths of sub-signals IPT and DPT, and by appropriate selection of temperature offset T1, compensation signal COMP can be made to have its minimum point P' at temperature Tc to coincide with the maximum point P of the temperature-to-temperature characteristic curve of FIG. 11.

Figure 16:
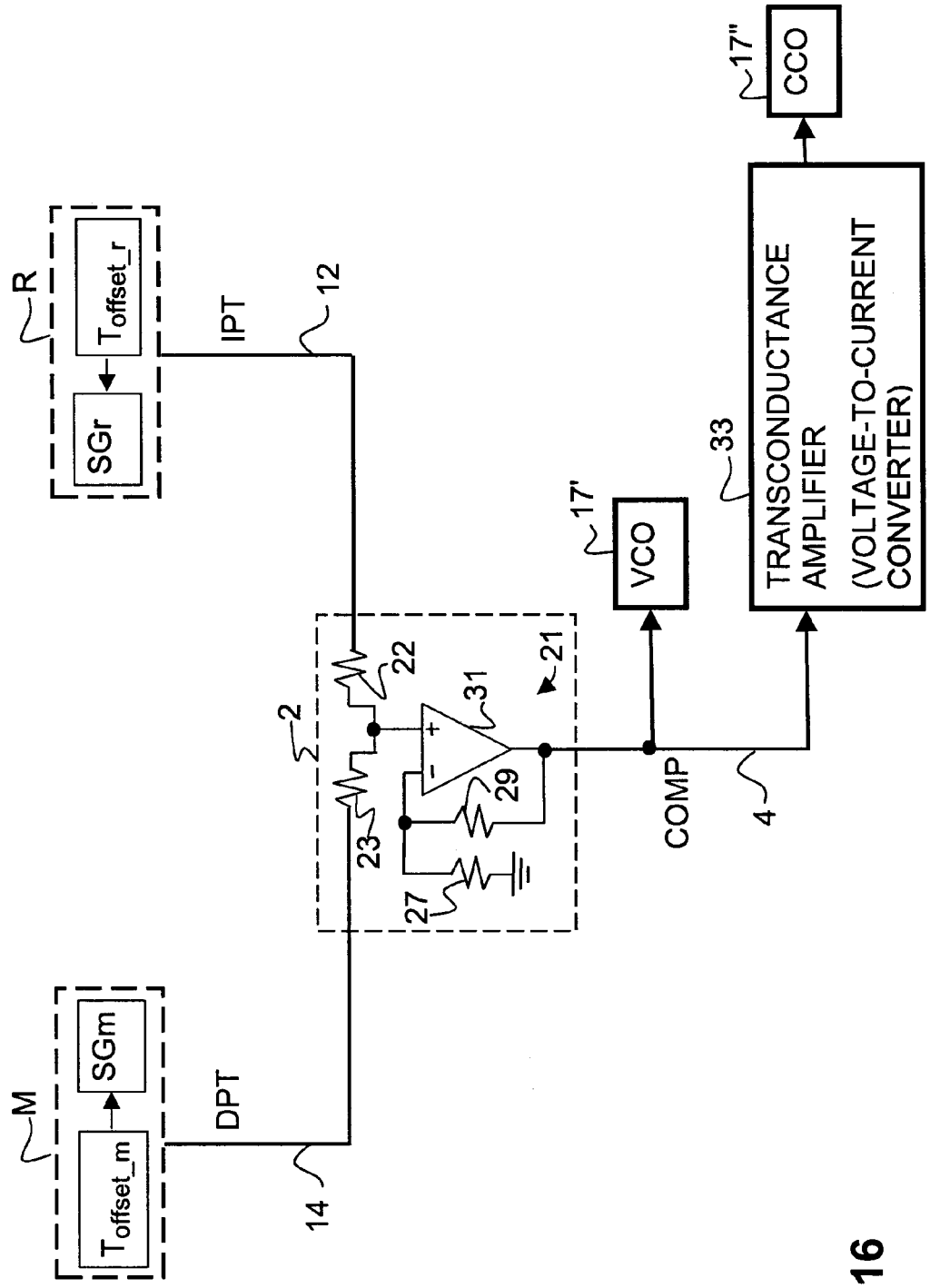
FIG. 16 is a voltage-based implementation of summation node 2 of FIG. 14.
Figure 17:
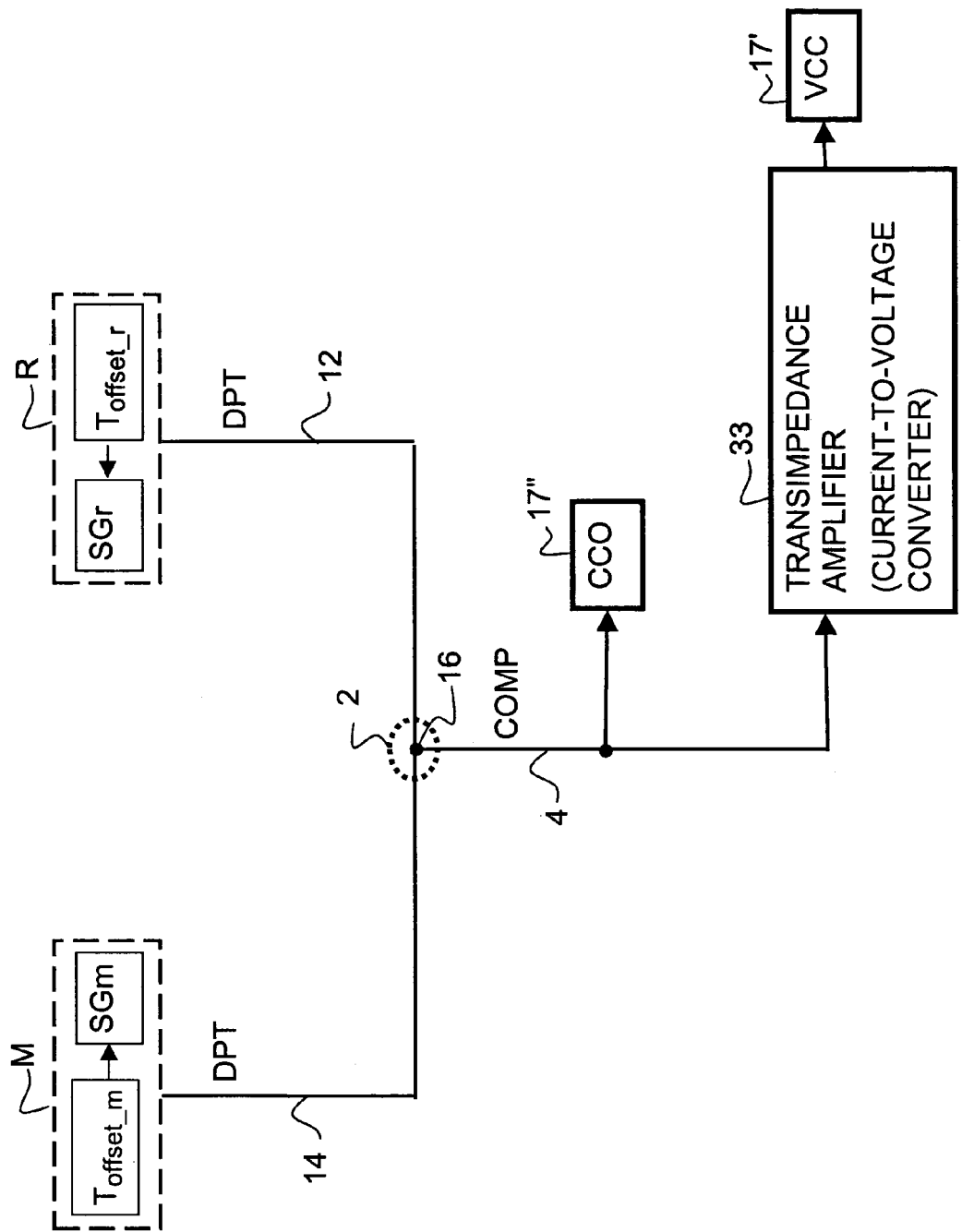
FIG. 17 is a current-based implementation of summation node 2 of FIG. 14.
Figure 18:
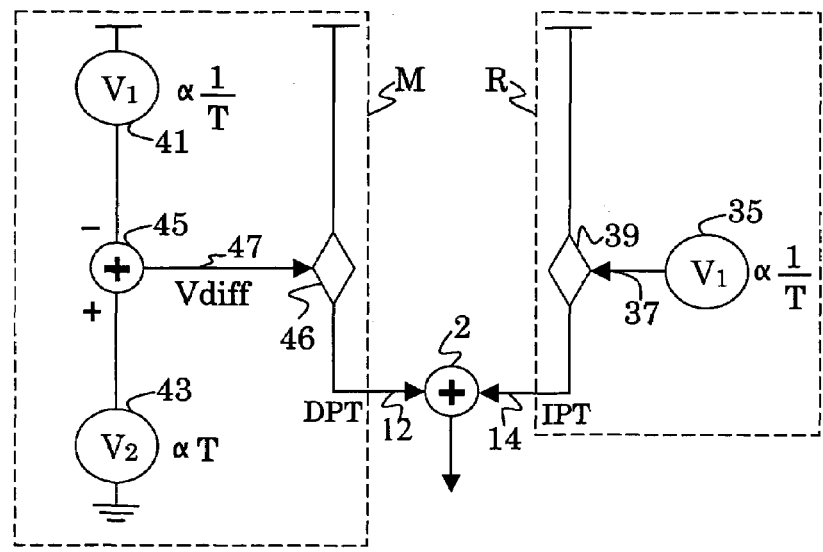
FIG. 18 is a symbolic voltage-based implementation of modules M and R of FIG. 14.
Figure 20:
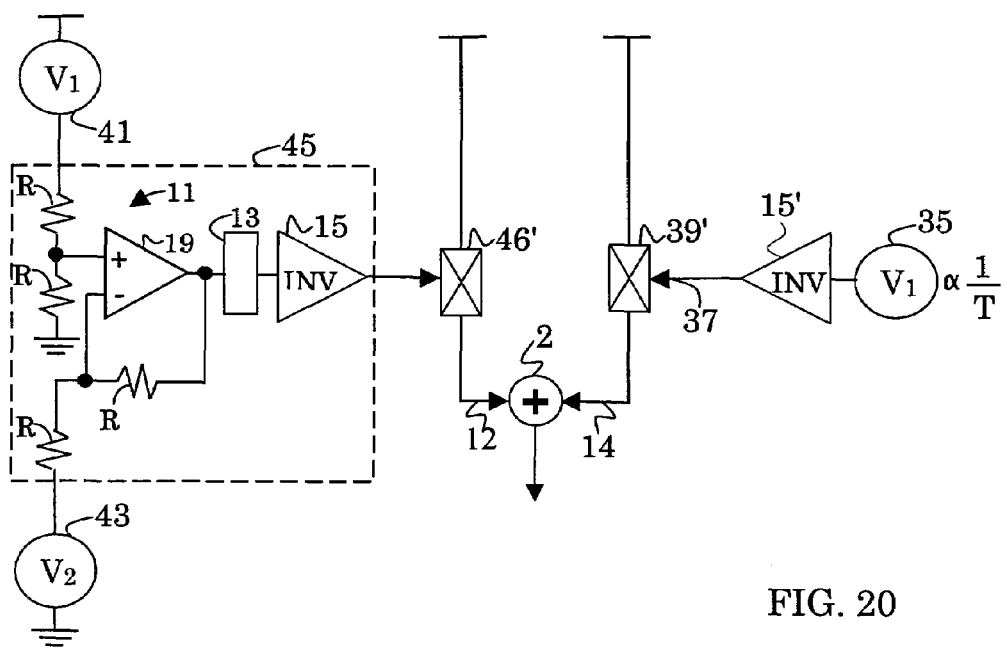
FIG. 20 is an exemplary circuit level implementation of the structure of FIG. 18.
Figure 19:
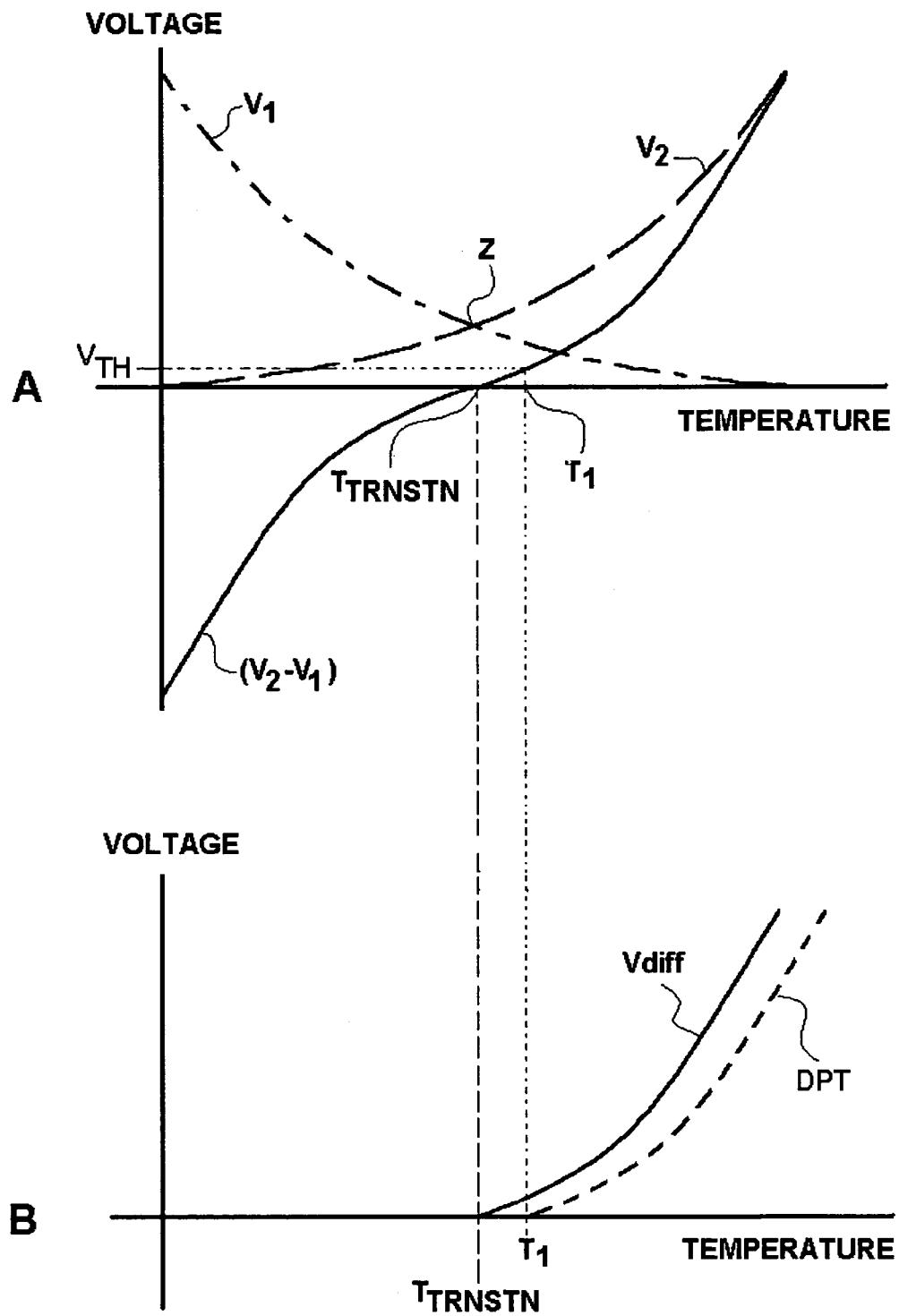
FIG. 19 shows descriptive voltage curves of various nodes in FIG. 18.

As explained above, the present invention for shaping a compensation signal is applicable to both a voltage controlled oscillator and to a current controlled oscillator. For illustrative purposes, FIG. 16 shows the structure of FIG. 14 with a voltage-based implementation of summation node 2, and FIG. 17 shows a current based implementation of summation node 2. Similarly, FIGS. 18–20 show an exemplary voltage based implementation of modules M and R of FIG. 14, while FIGS. 20–24 show a current based implementation of modules M and R of FIG. 14. It is to be understood that these implementations may be mixed and matched, as desired. All elements in FIGS. 16–24 similar to those of FIG. 14–15 have similar reference characters and are described above.

In FIG. 16, summation node 2 is implemented as a non-inverting voltage summer 21 consisting of first and second input resistors 23 and 22 respectively coupling output lines 14 and 12 to the non-inverting input of a differential amplifier 31. The inverting input of differential amplifier 31 is coupled to ground through resistor 27 and coupled to its output through resistor 29. An appropriate selection of resistive values for resistors 22–29, as is well known in the art, provides output signal $V_O$ on line 4 with a value equal to the sum of the voltage signals on lines 12 and 14. This output signal $V_O$ may be applied directly to a voltage control oscillator 17', or alternatively may be converted to a representative current signal by a transconductance amplifier 33 (i.e. voltage-to-current converter) and applied to a current controlled oscillator 17''.

In FIG. 17, summing node 2 is implemented as a wire routing node (or conductive lead) 16 for summing current signals on lines 14 and 12 from signal generators SGm and SGr, respectively. The resultantly summed current signal on line 4 may be applied directly to current controlled oscillator 17'', or may be converted to a representative voltage signal by a transimpedance amplifier 35 (i.e. current-to-voltage converter) and applied to a voltage controlled oscillator 17'.

With reference to FIG. 18, a symbolic voltage-based implementation of modules M and R of FIG. 14 shows a different structure for each of modules M and R. In module M, temperature offset $T_{offset\_m}$ and signal generator SGm of FIG. 14 are combined into a single circuit structure having a first voltage source 41 producing a first voltage signal $V_1$, a second voltage source 43 producing a second voltage signal $V_2$, a voltage summing node 45, and a first dependent voltage source 46. However, since temperature offset $T_{offset\_r}$ of FIG. 14 is not necessary for achieving the compensation signal COMP of FIG. 15, temperature offset $T_{offset\_r}$ is omitted from the presently preferred implementation of module R. This simplifies the structure of module R, which now consists of only a third voltage source 35 and a second dependent voltage source 39.

The operation of module R is relatively straight forward. The inverse temperature dependence of module R is achieved by the use of third voltage source 35, which preferably produces an output voltage inversely proportional to temperature. Dependent voltage source 39 produces a voltage signal whose magnitude is dependent on the output from third voltage source 35. Dependent voltage source 39 thereby provides any desired gain adjustments to the output of third voltage source 35 prior to outputting signal IPT on line 14.

The temperature dependence and temperature offset of module M, however, is achieved by an appropriate imbalance in the temperature dependence of first voltage source 41 and second voltage source 43, and by specific behavioral characteristics of voltage summing node 45. Specifically, for temperatures, T, up to a predefined transition temperature $T_{TRNSITN}$, the magnitude of first voltage source 41 is made greater than, or at least equal to, the magnitude of second voltage source 43, as summarized here.

$$|V_1| \geq |V_2| \text{ for } T \leq T_{TRNSITN}$$

Also, for temperatures T higher than the predefined transition temperature $T_{TRNSITN}$, the magnitude of first voltage source 41 is made smaller than the magnitude of second voltage source 43, as summarized here.

$$|V_1| < |V_2| \text{ for } T > T_{TRNSITN}$$

To achieve these conditions, the voltage $V_1$ of first voltage source 41 is preferably inversely proportional to temperature ($\alpha[1/T]$), and the voltage $V_2$ of second voltage source 43 is preferably directly proportional to temperature ($\alpha T$). Thus when temperature is low, signal $V_1$ is greater than $V_2$, and when temperature is high, $V_2$ is greater than $V_1$. The temperature dependence characteristics of voltage sources 41 and 43 are selected such that the transition in magnitude dominance from $V_1$ to $V_2$ occurs at transition temperature $T_{TRNSITN}$.

Voltage summer node 45 is preferably a difference summer such that the magnitude of first voltage source 41 is subtracted from the magnitude of the second voltage source 43. Furthermore, difference summer node 45 is preferably characterized by being restricted to outputting only positive voltage difference results and not negative voltage difference results. Preferably, when the difference of $V_2$ and $V_1$ (i.e. $|V_2|-|V_1|$) is positive, voltage summation node 45 outputs the representative positive voltage difference on line 47. But when the difference of $V_2$ and $V_1$ is negative, then voltage summation node 45 preferably outputs a reference zero. That is, voltage summation node 45 preferably has a zero volt floor such that it outputs no voltage lower than zero volts. This behavior is illustrated in FIG. 19.

The upper plot A of FIG. 19 shows representative voltage versus temperature curves for voltage signals $V_1$ and $V_2$, and for their difference ($V_2-V_1$). The lower plot B shows the ideal output $V_{DIFF}$ of difference summation node 45, and also shows the corresponding signal DPT from dependent voltage source 46, which for illustrative purposes is assumed to have a unity gain. As shown in upper plot A, signal $V_1$ is a positive voltage that is inversely related to temperature, and is therefore high at lower temperatures and drops as the temperature rises. By contrast, signal $V_2$ from second voltage source 43 is directly related to temperature, and is therefore low at lower temperatures and high at higher temperatures.

Neither signal $V_1$ nor $V_2$ has any temperature offset, but a temperature offset is produced by the above-noted characteristics of summation node 45. The difference of $V_2$ and $V_1$ is negative at lower temperatures where $V_1$ is greater than $V_2$, as indicated by curve ($V_2-V_1$). However, as the temperature rises to transition temperature $T_{TRNSITN}$ and $V_1$ becomes equal to $V_2$ at point Z, curve ($V_2-V_1$) crosses the zero volt axis and becomes positive as signal $V_2$ continues to increase. Since curves $V_1$ and $V_2$ have exponentially decreasing and increasing shapes, respectively, the resulting ($V_2-V_1$) curve has a tangent-curve shape that is dominated by signal $V_1$ at lower temperatures and is dominated by signal $V_2$ at higher temperatures.

As explained above, difference summation node 45 preferably outputs a zero valued signal when ($V_2-V_1$) is negative, and only outputs a signal for positive values of ($V_2-V_1$). Therefore in the lower plot B of FIG. 19, signal $V_{DIFF}$ is shown to have a value of zero until transition temperature $T_{TRNSITN}$ is reached. At this point, signal $V_{DIFF}$ is defined by the positive values of ($V_2-V_1$), which results in signal $V_{DIFF}$ having an exponentially increasing curve.

For practical implementation reasons, it is preferred that dependent source 46 be modeled to have a threshold offset, $V_{TH}$, indicated by a horizontal dotted line in the upper plot A. In the present case, the threshold offset would be a voltage threshold, such as is characteristics of transistors. Therefore, dependent voltage source 46 does not produce its output signal DPT until signal $V_{DIFF}$ from difference summation node 45 reaches threshold voltage $V_{TH}$ at temperature $T_1$.

With reference to FIG. 20, an sample circuit implementation of the voltage-based symbolic structure of FIG. 18 implements dependent voltage sources 46 and 39 as transistors 46' and 39', respectively, and implements summation node 45 as a series connection of a difference summer circuit 11, a nonsymmetric clipping circuit 13, and an inverting amplifier 15.

Difference summer circuit 11 takes the difference of $V_2$ and $V_1$, and is constructed around a differential amplifier 19. The non-inverting input of differential amplifier 19 is coupled to receive signal $V_1$ through a first resistor R, and is coupled to ground through a second resistor R. The inverting input of differential amplifier 19 is coupled to receive signal $V_2$ through a third resistor R and is coupled to the output of differential amplifier 19 through a fourth resistor R. As it is known in the art, this circuit configuration results in differential amplifier 42 having an output signal substantially equal to ($V_2-V_1$). The requirement that all negative values be clipped at zero volts may be achieved by use of nonsymmetric clipping circuit 13. Since dependent voltage source 46 is implemented as a transistor 46' in an inverting amplifying configuration, inverting amplifier 15 may be used to counteract the inverting action of transistor 46' to produce signal DPT of FIG. 19. Nonsymmetric clipping circuit 13 and inverting amplifier 15 are well known circuits, and are not discussed further herein.

Since dependent voltage source 46 is implemented as transistor 46', the transistor's inherent threshold voltage provides the offset threshold $V_{TH}$ described in the upper plot A of FIG. 19. Similarly, dependent voltage source 39 may be implemented with transistor 39' in an inverting amplifier configuration, which may require a second inverting amplifier 15' to compensate for the inverting action of transistor 39'. Transistors 46' and 39' may be BJT, MOS, JFET, or other known transistors types.

The present invention can be achieved more simply by using a current-based implementation for the structure of FIG. 14. Therefore, the preferred embodiment of the present invention is a current-based circuit implementation.

Figure 21:
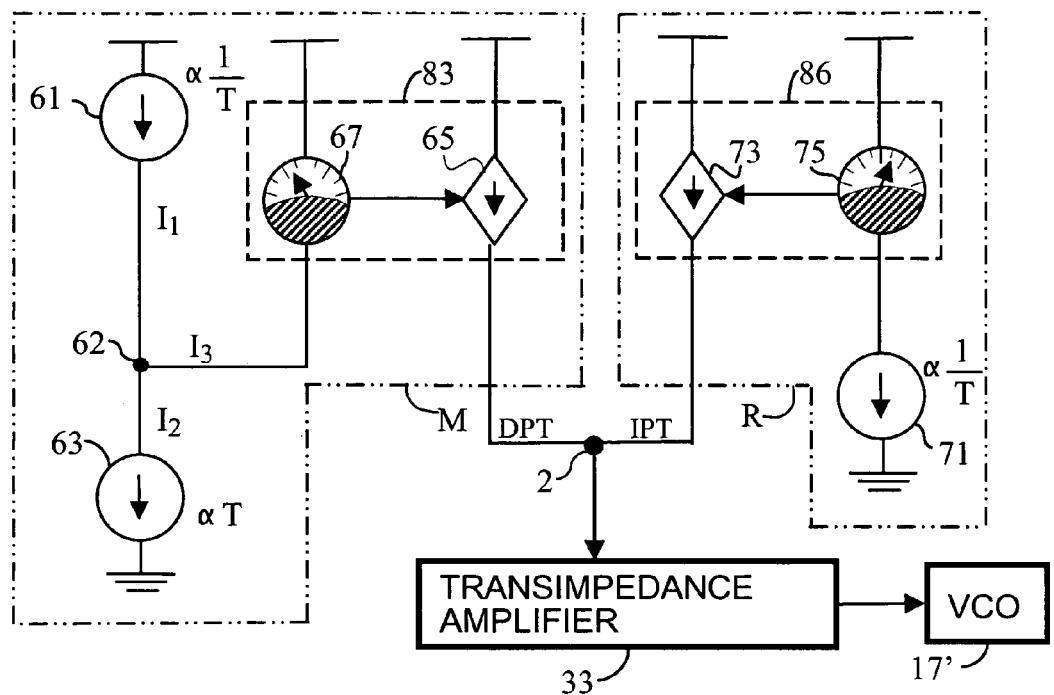
FIG. 21 is a symbolic current-based implementation of modules M and R of FIG. 14.

With reference to FIG. 21, a current based implementation of the present invention preferably combines temperature offset $T_{offset\_m}$ and signal generator SGm of FIG. 14 into a single circuit within module M. Furthermore, temperature offset $T_{offset\_r}$ is preferably omitted from module R.

Module M is implemented using a current source 61 having a source current $I_1$, a current sink 63 having a drain current $I_2$, and a dependent current source 65. The output from dependent current source 65 is dependent upon the difference of $I_1$ and $I_2$, which is symbolically represented by a current meter 67. In effect, current meter 67 and dependent current source 65 form a first current mirror 83 to mirror the difference current of node 62.

Module R includes a second current sink 71 and a second dependent current source 73. The output from second dependent current source 73 is dependent upon the current through current sink 71, which is symbolically represented by a second current meter 75. Thus, current meter 75 and dependent current source 73 form a second current mirror 86 to mirror the current through current sink 71. It is to be understood that current sink 71 may be replaced by a current source without deviating from the present invention.

Although FIG. 21 shows a current-based implementation of modules M and R, it is preferred that these modules be used to control a voltage controlled oscillator 17', such as shown in FIG. 17. Therefore, the output from summation node 2 is shown coupled to transimpedance amplifier 33 to convert the output current signal from summation node 2 into a representative voltage signal used to control voltage controlled oscillator 17'.

Preferably, second current sink 71 produces a current whose magnitude is inversely proportional to temperature, such that second dependent current source 73 likewise produces a current inversely proportional to temperature.

In module M, the source current $I_1$ of ideal current source 61 is preferably greater than, or equal to, drain current $I_2$ of ideal current sink 63 for temperatures T up to predefined transition temperature $T_{TRNSITN}$, as summarized here.

$|I_1| \geq |I_2|$ for $T \leq T_{TRNSITN}$

For temperatures T higher than the predefined transition temperature $T_{TRNSITN}$, the magnitude of current source 61 is made smaller than the magnitude of current sink 63, as summarized here.

$|I_1| < |I_2|$ for $T > T_{TRNSITN}$

To achieve these conditions, current $I_1$ of first current source 61 is preferably inversely proportional to temperature ($\alpha[1/T]$), and the current $I_2$ of first current sink 63 is preferably directly proportional to temperature ($\alpha T$). In this manner when temperature is low, signal $I_1$ is greater than $I_2$, and when temperature is high $I_2$ is greater than $I_1$. The temperature dependence characteristics of current source 61 and current sink 63 are such that the transition in magnitude dominance from $I_1$ to $I_2$ occurs at temperature $T_{TRNSITN}$.

The difference of $I_1$ and $I_2$ is taken at node 62, and this difference current $I_3$, as symbolically observed by current meter 67, determines the output current from dependent current source 67. As before, dependent current source preferably outputs a signal DPT only when the difference of $I_2$ and $I_1$ (i.e. $|I_2|-|I_1|$) is positive, and outputs no signal when the difference of $I_2$ and $I_1$ is negative.

In a manner analogous to the voltage representation of FIG. 19, the magnitude of current $I_1$ is high at low temperatures, and decreases as temperature T increases. Conversely, the magnitude of current $I_2$ is low at low temperatures and grows exponentially with increasing temperature. The output DPT of dependent current source 65 ideally remains low while $I_1$ is greater than $I_2$, and starts flowing only as $I_2$ becomes greater than $I_1$ (and preferably rises above a threshold value). As the temperature gets much greater and $I_1$ diminishes sufficiently, signal DPT begins to follow $I_2$ such that signal DPT exhibits an exponential curvature.

As explained above, the structure of FIG. 21 uses ideal current sources, and places a limitation that dependent current source 65 should have no output when $I_1$ is greater than $I_2$ in order to achieve the temperature offset $T_1$, and thus the desire current curve for signal DPT. However, these output limitations are inherent in physical circuit components used in the construction of a practical circuit implementation of the structure of FIG. 21, and thus do not pose any added burden to its construction.

Figure 22:
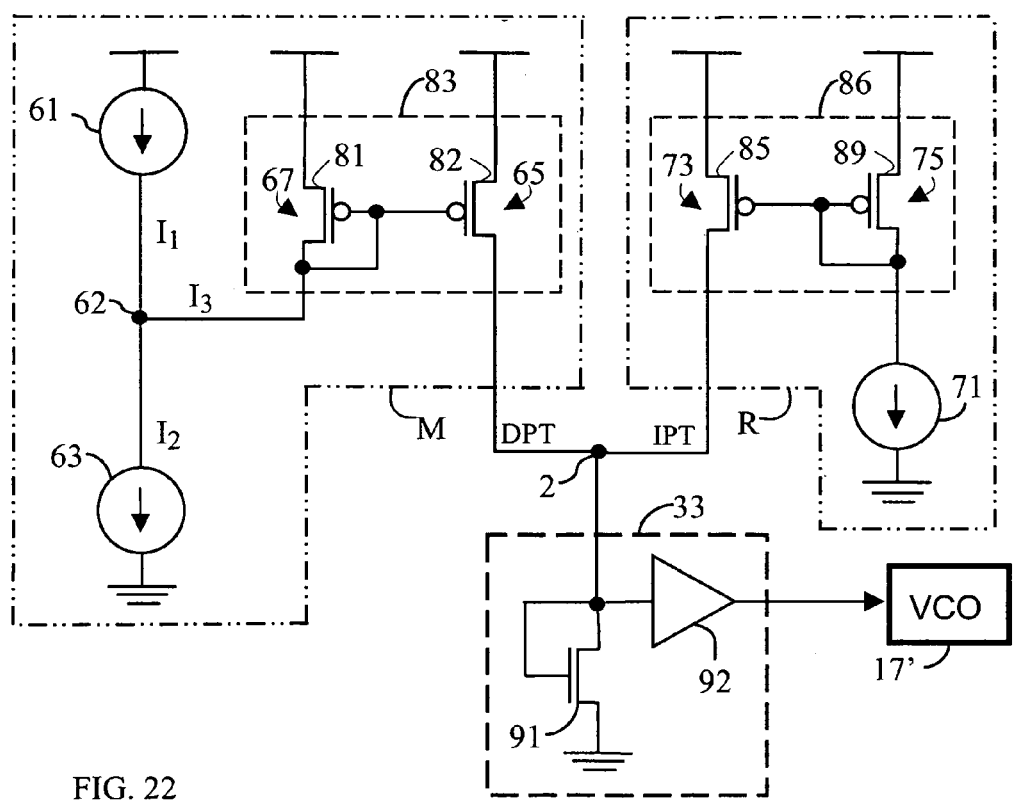
FIG. 22 is a partial circuit implementation of the structure of FIG. 21.

With reference to FIG. 22, the preferred circuit implementation of the present invention preferably uses MOS technology. It is to be understood that other technologies, such as BJT or NFET, may be used. Further preferably, first current source 61 and current sink 71 are implemented using non-ideal (i.e. practical) CTAT (complementary to absolute temperature) reference circuits, and preferably current sink 63 is implemented using a non-ideal PTAT (proportional to absolute temperature) reference circuit. PTAT and CTAT reference circuits are well known in the art, and are not explained in detail here.

Current meters 67 and 75 are implemented as respective diode-connected PMOS transistors 81 and 89. Also, dependent current sources 65 and 73 are respectively implemented as PMOS transistors 82 and 85. The potential at the control gates of diode-connected transistors 81 and 89 fluctuates with their respective source-to-drain currents, such that the potential at their control gates becomes a measure of their respective source-to-drain currents. Since the control gate of PMOS transistor 82 is tied to the control gate of diode-connected transistor 81, fluctuation in the source-to-drain current of diode-connected transistor 81 are mirrored in PMOS transistor 82. In other words, diode-connected transistor 81 and PMOS transistor 82 constitute current mirror 83, which mirrors the difference current of summation node 62. Similarly, diode-connected transistor 89 and PMOS transistor 85 form second current mirror 86, and mirror the current through current sink 71.

The non-ideal behavior of the CTAT and PTAT reference circuits implies that no infinite or negative voltages are generated anywhere in the circuit, which might otherwise force diode-connected transistor 81 to unintentionally turn ON. In other words, when CTAT based current source 61 is greater than PTAT based current sink 63 (i.e. at low temperatures), all the current through current sink 63 is supplied by current source 61 and the current through summation node 62 is thus limited by the lower magnitude of current sink 63. As a result, the voltage potential at node 62 rises toward the upper power rail, Vcc. Therefore, the voltage potential at the drain electrode and the control gate electrode of diode-connected transistor 81 also rises toward Vcc causing diode-connected transistor 81 to turn OFF. Since PMOS transistor 82 and diode-connected transistor 81 share the same control gate connection, PMOS transistor 82 is also turned OFF. Therefore, PMOS transistor 82 contributes no signal to summation node 2 while current source 61 is stronger than current sink 63, and summation node 2 thus outputs only the current supplied by transistor 85.

On the other hand, when the current of PTAT based current sink 63 is greater than the current of CTAT based current source 61 (i.e. at higher temperatures), current source 61 cannot supply all the current drawn by current sink 63 causing the potential at node 62 to be drawn toward ground, i.e. the lower power rail. As a result, diode-connected transistor 81 is turned ON and begins producing a source-to-drain current to make up the difference between current sink 63 and current source 61. The current through diode-connected transistor 81 is mirrored by PMOS transistor 82 with an optional amplification gain. At the same time, the current from CTAT based current sink 71 is mirrored in current mirror 86. Thus, the currents from PMOS transistors 82 and 85 are combined at summation node 2 and transferred to transimpedance amplifier 33.

Transimpedance amplifer 33 preferably consists of a diode-connected NMOS transistor 91 and a voltage amplifier 92. Diode-connected NMOS transistor 91 converts the current from summation node 2 into a representative voltage potential at its drain electrode. The drain voltage of NMOS transistor 91 is coupled to voltage amplifier 92, and transferred to voltage controlled oscillator 17'.

Figure 23:
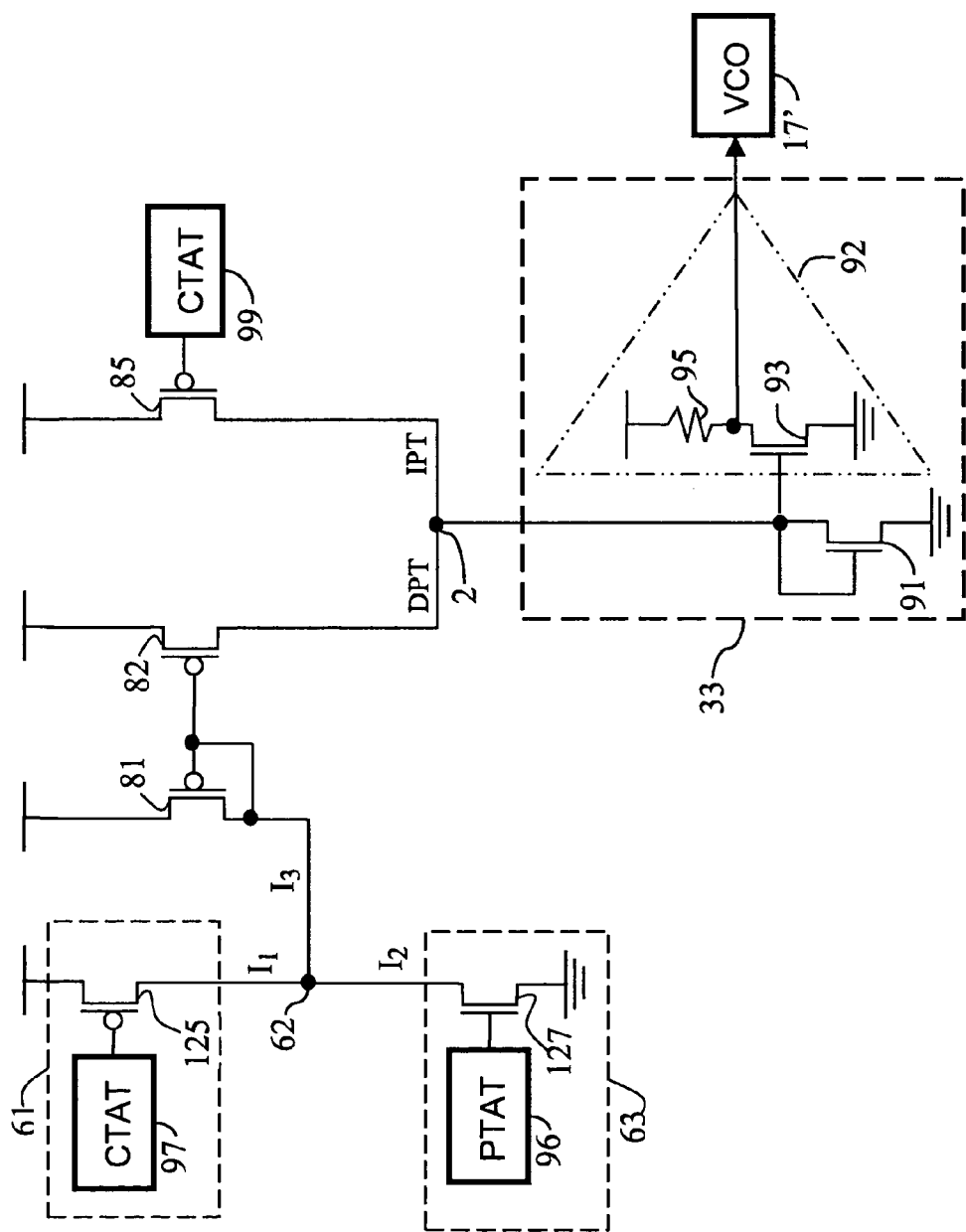
FIG. 23 is a combined circuit-level and block-level diagram of a preferred implementation of the structure of FIG. 21.

A CTAT circuit typically includes a current mirror that can function in place of current mirror 86. Therefore transistor 89 (of current mirror 86) and current sink 71 are preferably incorporated into a CTAT source 99, as shown in FIG. 23. By adjusting the size of transistor 85, one can adjust the weight, i.e. the relative amplification, of the signal from transistor 85 to summation node 2.

As further shown in FIG. 23, current source 61 preferably includes a CTAT reference circuit 97 coupled to control the current through a PMOS transistor 125, and current sink 63 consists of a PTAT reference circuit 96 coupled to control the current through an NMOS transistor 127. As in the case of CTAT 99 and transistor 85, PMOS transistor 125 is used to adjust the weight of the signal from CTAT 97, and NMOS transistor 127 is used to adjust the weight of the signal from PTAT 96.

Additionally, amplifier 92 is illustratively implemented as an MOS transistor 93 and resistor 95 coupled in a voltage follower configuration to generate an amplified voltage representation of the current through diode-connected transistor 91. For the sake of simplicity, biasing components for establishing the operating point of amplifier 92 are not shown, since they are considered to be within the scope of one versed in the art. Similarly, amplifier biasing components are not shown in FIGS. 24 and 25.

Figure 24:
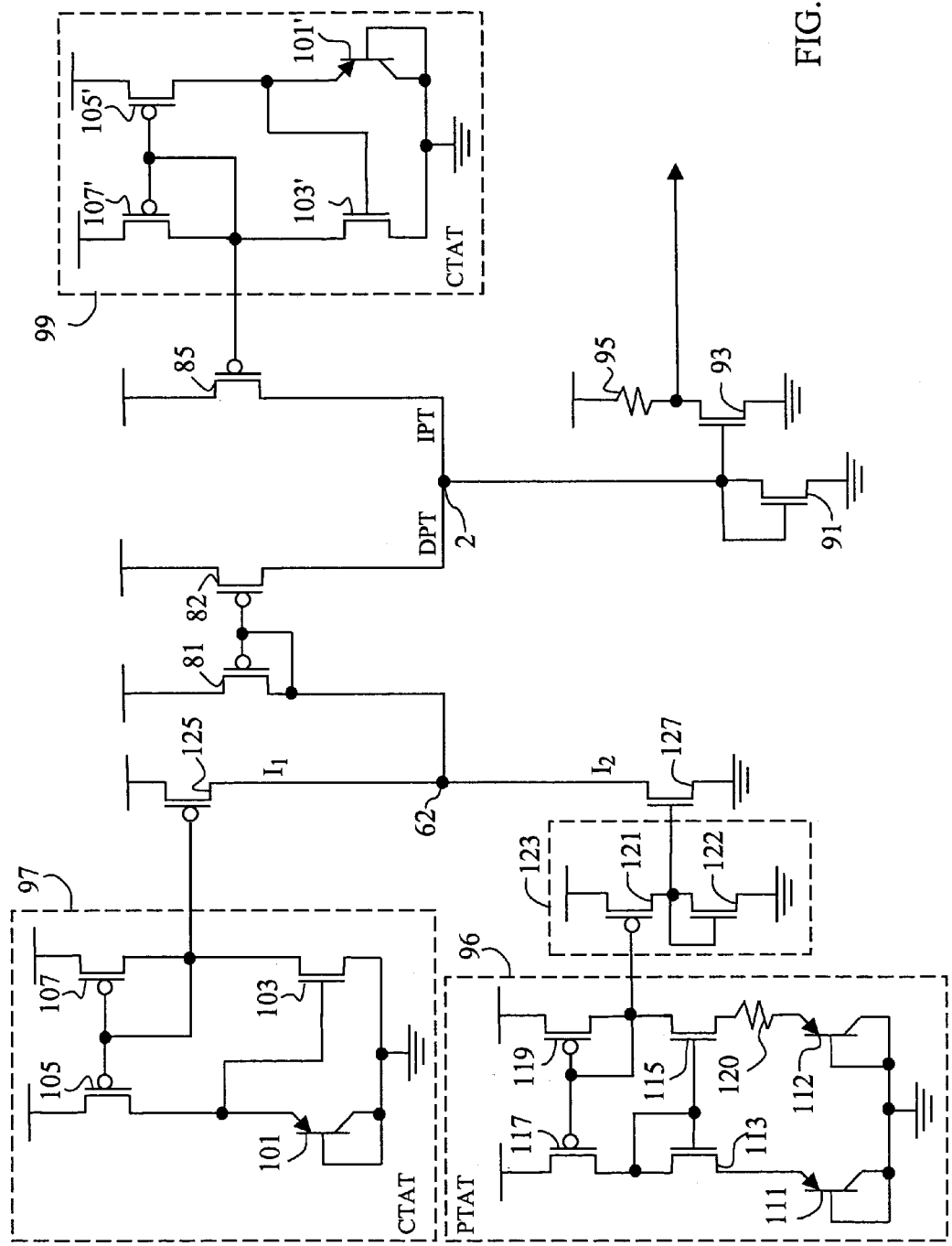
FIG. 24 is a first circuit-level implementation of the structure of FIG. 23.

With reference with FIG. 24, a transistor level implementation of the present invention is shown. All elements similar to FIGS. 21–23 have similar reference characters and are described above. As it is known in the art, CTAT and PTAT reference circuits make use of a parasitic PNP transistor found in an MOS n-well process. Typically, the emitter is defined by the P+ implant, the based is comprised by the n-well, and the collector is formed by the p-type substrate. In a typical configuration, the parasitic transistor's base is tied to the substrate, which functions as its collector. This collector is coupled to Vss. As a result, the parasitic PNP transistor is diode connected. Exemplary CTAT reference sources 97 and 99, and exemplary PTAT reference source 96 preferably use typical circuit structures based on this type of parasitic PNP transistor.

Bipolar transistor, PNP 101, along with MOS transistors 103, 105, and 107 form CTAT reference source 97. CTAT current source 99 is similar to CTAT 97, and all elements in CTAT 99 similar to those of CTAT 97 are identified by a prime symbol (i.e. 101', 103', 105', and 107') and serve a similar function as those of CTAT 97. CTAT circuits 97 and 99 make use of the negative temperature coefficient of the $V_{BE}$ parameter of PNP transistors 101 and 101', respectively, to generate signals that are complementary to absolute temperature (i.e. a CTAT signal). As it is known in the art, this signal is not purely CTAT (i.e. it is not linear), but rather is curved. However, as explained above, the present invention makes use of this curvature to achieve the invention objectives.

PMOS transistor 107 is coupled to PMOS transistor 125 in a current mirror fashion. Similarly, PMOS transistor 107' is coupled to transistor 85 in a current mirror fashion. The voltage at the drain of PMOS transistor 107 is used to generate current $I_1$ in transistor 125, and the voltage at the drain of PMOS transistor 107' is used to generate current IPT in transistor 85.

PTAT reference source 96 is comprised of PNP transistors 111 and 112, along with MOS transistors 113, 115, 117, and 119 and resistor 120.

PTAT 96 uses the difference in $V_{BE}$ of PNP transistors 111 and 112, which are of different physical area and thus have different current densities, to produce a signal that is proportional to absolute temperature (i.e. a PTAT signal). As before, the resultant signal is curved, not linear, but the present invention makes use of this curved signal to achieve the invention objectives. Transistors 121 and 122 constitute an amplifier 123, which together with NMOS transistor 127 provide the appropriate weight to create current $I_2$.

Figure 25:
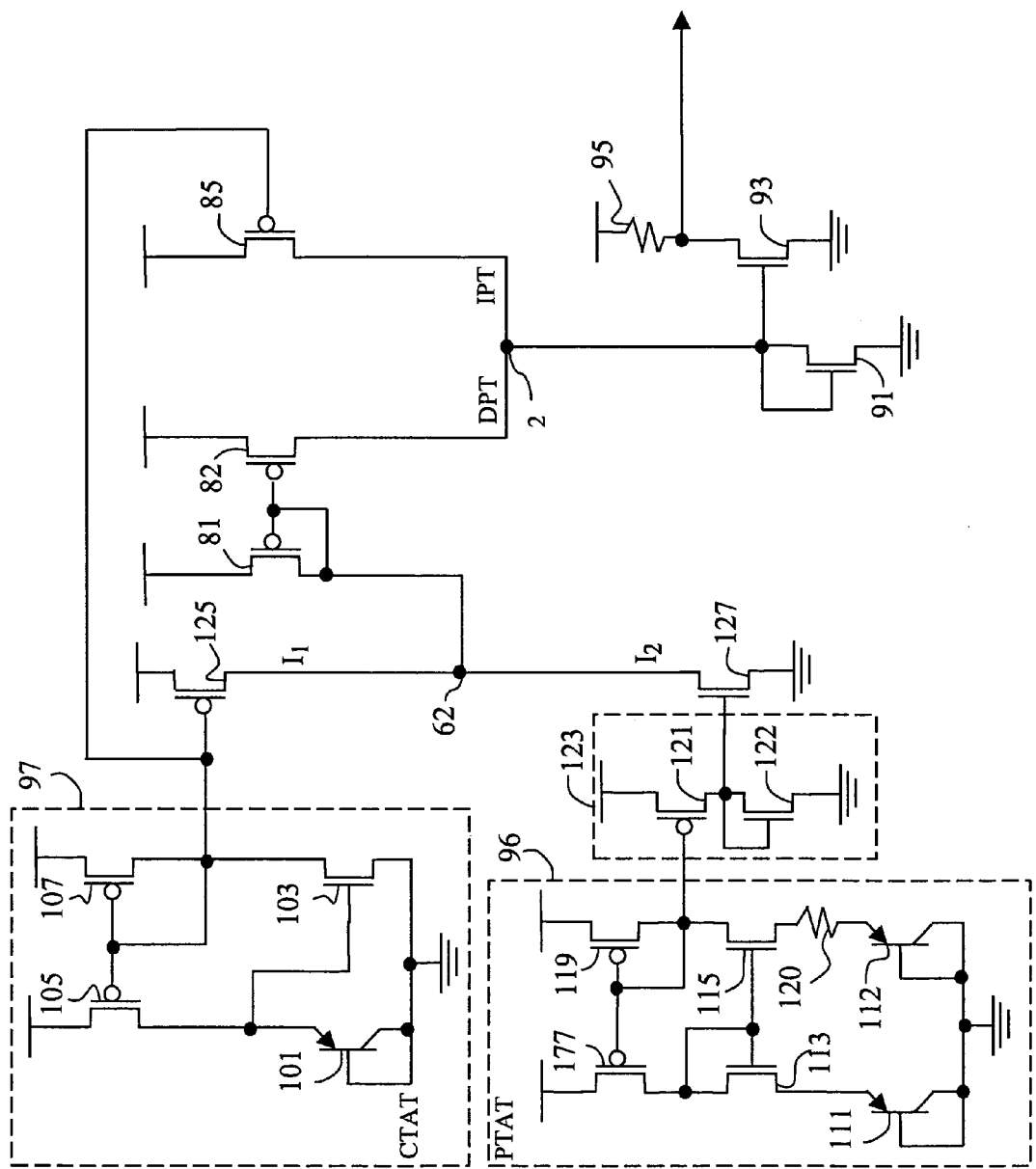
FIG. 25 is a second circuit-level implementation of the structure of FIG. 23.

As is evident from the above description, the circuit of CTAT 97 and the circuit of CTAT 99 are similar, and in a further simplification of the present invention, shown in FIG. 25, CTAT 99 is eliminated. Instead, the output of CTAT 97 is coupled to drive both transistor 127 and transistor 85. The appropriate signal weights for current signals $I_1$ and IPT can be achieved by appropriate sizing of transistors 127 and 85. All elements in FIG. 25 similar to those of FIG. 24 have similar reference characters and are described above.

The present invention has been described in connection with various preferred embodiments thereof with reference to the accompanying drawings. However, various changes and modifications will be apparent to those skilled in the art based on the foregoing description. Such changes and modifications are intended to be included within the scope of the present invention to the extent they fall within the scope of the appended claims.

What is claimed is:

1. A temperature compensation circuit, comprising:
    a plurality of first modules each effective for producing a respective first signal directly proportional to temperature
    a plurality of second modules each effective for producing a respective second signal inversely proportional to temperature;
    a first summing node for summing all of said first and second signals and producing a resultant summed signal.

2. The temperature compensation circuit of claim 1, wherein:
    the strength of each first signal of said plurality of first modules is individually selectable; and
    the strength of each second signal of said plurality of second modules is individually selectable.

3. The temperature compensation circuit of claim 1, wherein said plurality of first modules have differing temperature characteristic curve shapes.

4. The temperature compensation circuit of claim 1, wherein said plurality of second modules have differing temperature characteristic curve shapes.

5. The temperature compensation circuit of claim 1, wherein each of said plurality of first modules has an optionally assigned first temperature offset, wherein each of said plurality of first modules is precluded from outputting its respective first signal for temperatures below its respectively assigned first temperature offset.

6. The temperature compensation circuit of claim 5, wherein said plurality of first modules have differing first temperature offset values.

7. The temperature compensation circuit of claim 1, wherein each of said plurality of second modules has an optionally assigned second temperature offset, wherein each of said plurality of second modules is precluded from outputting its respective second signal for temperatures below its respectively assigned second temperature offset.

8. The temperature compensation circuit of claim 7, wherein said plurality of second modules have differing second temperature offset values.

9. The temperature compensation circuit of claim 1, wherein:
    each of said plurality of first modules has an optionally assigned first temperature offset, wherein each of said plurality of first modules is precluded from outputting its respective first signal for temperatures below its respectively assigned first temperature offset; and
    each of said plurality of second modules has an optionally assigned second temperature offset, wherein each of said plurality of second modules is precluded from outputting its respective second signal for temperatures below its respectively assigned second temperature offset.

10. The temperature compensation circuit of claim 9, wherein:
said plurality of first modules have differing first temperature offset values; and
said plurality of second modules have differing second temperature offset values.

11. The temperature compensation circuit of claim 1, wherein each of said plurality of first modules and each of said plurality of second modules includes a first CTAT signal source.

12. The temperature compensation circuit of claim 11, wherein at least one of said plurality of first modules further includes:
a CTAT signal source;
a PTAT signal source;
a second summing node for creating a difference signal based on the difference in signal magnitude of said CTAT signal source and said PTAT signal source;
and a first dependent signal generator for producing an intermediate signal dependent on said difference signal.

13. The temperature compensation circuit of claim 12, wherein said dependent signal generator produces said intermediate signal only if said difference signal is above a predetermined threshold value.

14. The temperature compensation circuit of claim 12, wherein said difference signal is a measure of a temperature offset, wherein said at least one of said plurality of first modules produces substantially no signal for temperatures below said temperature offset.

15. The temperature compensation circuit of claim 12, wherein:
for temperatures lower than a predefined transition temperature the magnitude of said CTAT signal source is greater than said PTAT signal source; and
for temperatures higher than said predefined transition temperature the magnitude of said PTAT signal source is greater than said CTAT signal source.

16. A temperature compensated oscillator comprising:
the temperature compensation circuit of claim 1;
a variable frequency oscillator responsive to the output of said first summing node.

17. The temperature compensated oscillator of claim 16, wherein said variable frequency oscillator is a surface acoustic wave resonator.

18. An electronic device including the temperature compensation circuit of claim 1.

19. A temperature compensation circuit, comprising:
a first temperature dependent signal generator having a first activation temperature, said first temperature dependent signal generator being effective for producing a first signal proportional to temperature when temperature is not lower than said first activation temperature and for producing substantially no signal when temperature is below said first activation temperature;
a second temperature dependent signal generator, said second temperature dependent signal generator being effective for producing a second signal inversely proportional to temperature when temperature is not lower than a second activation temperature;
a first summing node for summing said first signal and said second signal and outputting the result on a first summation output node;
wherein said first temperature dependent signal generator includes:
a first signal source for producing a first sub-signal inversely proportional to temperature;
a second signal source for producing a second sub-signal directly proportional to temperature; and
a second summing node for subtracting the magnitude of said first sub-signal from the magnitude of said second sub-signal;
wherein for temperatures lower than a predefined transition temperature the magnitude of said first sub-signal is not less than the magnitude of said second sub-signal, and for temperatures not lower than said predefined transition temperature the magnitude of said first sub-signal is less than the magnitude of said second sub-signal.

20. The temperature compensation circuit of claim 19, wherein said first signal source includes a complementary to absolute temperature (CTAT) circuit and said second signal source includes a proportional to absolute temperature (PTAT) circuit.

21. The temperature compensation circuit of claim 19, wherein said predefined transition temperature is proximate to said first activation temperature.

22. The temperature compensation circuit of claim 19, wherein said predefined transition temperature is lower than said first activation temperature.

23. The temperature compensation circuit of claim 19, wherein said predefined transition temperature is said first activation temperature.

24. The temperature compensation circuit of claim 19, wherein said first signal of said first temperature dependent signal generator is output from said second summing output node.

25. The temperature compensation circuit of claim 19 wherein said first and second sub-signals are voltage signals, and wherein said second summation node is a difference amplifier having an inverting input coupled to receive said first sub-signal and having a non-inverting input coupled to receive said second sub-signal.

26. The temperature compensation circuit of claim 19 wherein said first and second sub-signals are current signals, and wherein said second summation node is a circuit junction node, wherein:
a first lead couples said first signal source to said circuit junction node, a second lead couples said second signal source to said circuit junction node, and a third lead coupled to said circuit junction node outputs the resultant difference of said first and second sub-signals.

27. The temperature compensation circuit of claim 26 wherein said first signal source is a current source having its output coupled to said junction node by said first lead, and said second signal source is a current sink having its input coupled to said junction node by said second lead.

28. The temperature compensation circuit of claim 19, wherein said first temperature dependent signal generator further includes:
a first dependent signal generator for generating a weighted signal dependent on the output from said second summation output node.

29. The temperature compensation circuit of claim 28, wherein said weighted signal is said first signal of said first temperature dependent signal generator.

30. The temperature compensation circuit of claim 28, wherein said first dependent signal generator is effective for producing substantially no output signal when the output of said second summation output node is less than a predefined threshold value, and for producing said weighted signal when the output of said second summation output node is not less than said predefined threshold value.

31. The temperature compensation circuit of claim 28, wherein said first dependent signal generator is effective for producing substantially no output signal when the difference of the output magnitude of said first and second signal sources is a negative, and producing said weighted signal when the output of said second summation output node is positive.

32. The temperature compensation circuit of claim 28, wherein said first dependent signal generator is a transistor having a control input responsive to said second summation output node.

33. The temperature compensation circuit of claim 28, wherein said first dependent signal generator is a current mirror having a control input responsive to said second summation output node.

34. A temperature compensation circuit, comprising:
a first temperature dependent signal generator having a first activation temperature, said first temperature dependent signal generator being effective for producing a first signal proportional to temperature when temperature is not lower than said first activation temperature and for producing substantially no signal when temperature is below said first activation temperature;
a second temperature dependent signal generator, said second temperature dependent signal generator being effective for producing a second signal inversely proportional to temperature when temperature is not lower than a second activation temperature;
a first summing node for summing said first signal and said second signal and outputting the result on a first summation output node;
wherein said first signal and said second signal are voltage signals, and wherein said first summation node is a summing amplifier having a first summing input coupled to receive said first signal and a second summing input coupled to receive said second signal.

35. A temperature compensation circuit comprising:
a first temperature dependent signal generator having a first activation temperature, said first temperature dependent signal generator being effective for producing a first signal proportional to temperature when temperature is not lower than said first activation temperature and for producing substantially no signal when temperature is below said first activation temperature;
a second temperature dependent signal generator, said second temperature dependent signal generator being effective for producing a second signal inversely proportional to temperature when temperature is not lower than a second activation temperature;
a first summing node for summing said first signal and said second signal and outputting the result on a first summation output node;
wherein said second temperature dependent signal generator further includes:
a third sub-signal source; and
a second dependent signal generator for generating a second weighted signal dependent on the output from said third sub-signal source.

36. The temperature compensation circuit of claim 35, wherein said sub-signal source includes a complementary to absolute temperature (CTAT) circuit.

37. The temperature compensation circuit of claim 35, wherein said second weighted signal is said second signal of said second temperature dependent signal generator.

38. The temperature compensation circuit of claim 35, wherein said second dependent signal generator is a transistor having a control input responsive to said third sub-signal source.

39. The temperature compensation circuit of claim 35, wherein said second dependent signal generator is a current mirror having a control input responsive to said third sub-signal source.

40. A temperature compensation circuit, comprising:
a first temperature dependent signal generator having a first activation temperature, said first temperature dependent signal generator being effective for producing a first signal proportional to temperature when temperature is not lower than said first activation temperature and for producing substantially no signal when temperature is below said first activation temperature;
a second temperature dependent signal generator, said second temperature dependent signal generator being effective for producing a second signal inversely proportional to temperature when temperature is not lower than a second activation temperature;
a first summing node for summing said first signal and said second signal and outputting the result on a first summation output node;
further comprising:
a transimpedance amplifier having an input coupled to said first summation node;
a voltage controlled oscillator responsive to said transimpedance amplifier.

41. A temperature compensation circuit, comprising:
a first temperature dependent current signal generator having a first activation temperature, said first temperature dependent current signal generator being effective for producing a first current signal proportional to temperature when temperature is not lower than said first activation temperature and for producing substantially no signal when temperature is below said first activation temperature;
a second temperature dependent current signal generator, said second temperature dependent signal generator being effective for producing a second current signal inversely proportional to temperature;
a first summing node for summing said first current signal and said second current signal and outputting the result on a first summation output node;
wherein said first temperature dependent current signal generator includes:
a first current source inversely proportional to temperature; and
a first current sink directly proportional to temperature; and
a second summing node having a first lead coupled to said current source and a second lead coupled to said current sink;
wherein for temperatures lower than a predefined transition temperature the magnitude of the output current of said first current source is not less than the magnitude of the sinking current of said current sink, and for temperatures not lower than said predefined transition temperature the magnitude the output current of said current source is less than the magnitude of the sinking current of said current sink.

42. The temperature compensation circuit of claim 41, wherein said predefined transition temperature is proximate to said first activation temperature.

43. The temperature compensation circuit of claim 41, wherein said predefined transition temperature is lower than said first activation temperature.

44. The temperature compensation circuit of claim 41, wherein said predefined transition temperature is said first temperature.

45. The temperature compensation circuit of claim 41, wherein said first current signal of said first temperature dependent current signal generator is output from said second summation output node.

46. The temperature compensation circuit of claim 41, wherein said first temperature dependent current signal generator further includes:
   a first dependent current source coupled to said second summing node through a third lead, wherein said dependent current source produces a weighted current dependent upon the current through said third lead.

47. The temperature compensation circuit of claim 46, wherein said weighted signal is said first signal of said first temperature dependent current signal generator.

48. The temperature compensation circuit of claim 46, wherein said first dependent current source is effective for producing substantially no output current signal when the current through said third lead is less than a predefined threshold value, and for producing said weighted current signal when the current through said third lead is not less then said predefined threshold value.

49. The temperature compensation circuit of claim 46, wherein said first dependent current source includes a transistor having a control input coupled to said output third lead.

50. The temperature compensation circuit of claim 49, wherein said transistor is a BJT transistor.

51. The temperature compensation circuit of claim 49, wherein said transistor is an MOS transistor.

52. The temperature compensation circuit of claim 46, wherein said first dependent current source is a current mirror having a control input responsive to said second summation output node.

53. The temperature compensation circuit of claim 52, wherein said current mirror includes a diode-connected transistor coupled to said third lead, and includes an output transistor responsive to the said diode-connected transistor.

54. The temperature compensation circuit of claim 41, wherein said first current source includes a complementary to absolute temperature (CTAT) circuit and said first current sink includes a proportional to absolute temperature (PTAT) circuit.

55. A temperature compensation circuit, comprising:
   a first temperature dependent current signal generator having a first activation temperature, said first temperature dependent current signal generator being effective for producing a first current signal proportional to temperature when temperature is not lower than said first activation temperature and for producing substantially no signal when temperature is below said first activation temperature;
   a second temperature dependent current signal generator, said second temperature dependent signal generator being effective for producing a second current signal inversely proportional to temperature;
   a first summing node for summing said first current signal and said second current signal and outputting the result on a first summation output node;
   wherein said second temperature dependent signal generator further includes:
   a sub-signal source; and
   a second dependent current source for generating a second weighted signal dependent on the output from said sub-signal source.

56. The temperature compensation circuit of claim 55, wherein said sub-signal source includes a complementary to absolute temperature (CTAT) circuit.

57. The temperature compensation circuit of claim 55, wherein said sub-signal source is a second current source.

58. The temperature compensation circuit of claim 55, wherein said sub-signal source is a second current sink.

59. The temperature compensation circuit of claim 55, wherein said second dependent current source includes a transistor.

60. The temperature compensation circuit of claim 59, wherein said transistor is a BJT transistor.

61. The temperature compensation circuit of claim 59, wherein said transistor is an MOS transistor.

62. The temperature compensation circuit of claim 55, wherein said second dependent current source is a current mirror having a control input responsive to said sub-signal source.

63. The temperature compensation circuit of claim 62, wherein said current mirror includes a second diode-connected transistor responsive to said sub-signal source, and includes a second output transistor responsive to the said second diode-connected transistor.

64. The temperature compensation circuit of claim 55, wherein said second weighted signal is said second signal of said second temperature dependent signal generator.

65. A temperature compensated oscillator comprising:
   a temperature compensation circuit; and
   a variable frequency oscillator responsive to the output of said first summation node; wherein
   said temperature compensation circuit comprises:
   a first temperature dependent current signal generator having a first activation temperature, said first temperature dependent current signal generator being effective for producing a first current signal proportional to temperature when temperature is not lower than said first activation temperature and for producing substantially no signal when temperature is below said first activation temperature;
   a second temperature dependent current signal generator, said second temperature dependent signal generator being effective for producing a second current signal inversely proportional to temperature;
   a first summing node for summing said first current signal and said second current signal and outputting the result on a first summation output node.

66. The temperature compensated oscillator of claim 65, wherein said variable frequency oscillator is a current controlled oscillator.

67. The temperature compensation oscillator of claim 65, wherein said variable frequency oscillator is a voltage controlled oscillator coupled to said first summation node through a current-to-voltage converter.

* * * * *

UNITED STATES PATENT AND TRADEMARK OFFICE
CERTIFICATE OF CORRECTION

| | | |
|---|---|---|
| PATENT NO. | : 7,161,440 B2 | Page 1 of 1 |
| APPLICATION NO. | : 10/733143 | |
| DATED | : January 9, 2007 | |
| INVENTOR(S) | : David Meltzer | |

It is certified that error appears in the above-identified patent and that said Letters Patent is hereby corrected as shown below:

Column 20

Line 33, please change "summing output node" to --summing node--.

Column 23

Line 33, please change "said output third lead" to --said third lead--.

Signed and Sealed this

Seventeenth Day of June, 2008

JON W. DUDAS
*Director of the United States Patent and Trademark Office*